(12) United States Patent
Shimada

(10) Patent No.: US 7,299,540 B2
(45) Date of Patent: Nov. 27, 2007

(54) ELECTRONIC-COMPONENT FEEDING DEVICE

(75) Inventor: Katsumi Shimada, Kasukabe (JP)

(73) Assignee: Popman Corporation, Saitama (JP)

( * ) Notice: Subject to any disclaimer, the term of this patent is extended or adjusted under 35 U.S.C. 154(b) by 0 days.

(21) Appl. No.: 11/231,965

(22) Filed: Sep. 22, 2005

(65) Prior Publication Data

US 2006/0011645 A1   Jan. 19, 2006

Related U.S. Application Data

(63) Continuation of application No. PCT/JP2004/004216, filed on Mar. 25, 2004.

(30) Foreign Application Priority Data

Mar. 25, 2003 (JP) ............................. 2003-083146
May 13, 2003 (JP) ............................. 2003-134709
Oct. 30, 2003 (JP) ............................. 2003-370472

(51) Int. Cl.
 *B23P 19/00* (2006.01)
(52) U.S. Cl. ............................ 29/743; 29/740; 29/744; 196/174; 196/190; 226/76; 226/61; 226/67; 414/416.04
(58) Field of Classification Search .......... 29/739–744, 29/832; 193/44, 46; 198/383, 390, 396, 198/443; 221/157, 163, 171, 174, 190, 200, 221/212, 236, 263; 414/414, 759.07, 416.04, 414/795.7; 226/62, 67, 76
See application file for complete search history.

(56) References Cited

U.S. PATENT DOCUMENTS 4,250,615 A * 2/1981 Knuth et al. .................. 29/741
4,459,743 A * 7/1984 Watanabe et al. ............. 29/740
6,296,104 B1 * 10/2001 Ito et al. ...................... 221/212

FOREIGN PATENT DOCUMENTS

| JP | 61-63094 | 4/1986 |
|----|----------|--------|
| JP | 01-292897 | 11/1989 |
| JP | 03-024795 | 2/1991 |
| JP | 04-114886 | 4/1992 |

(Continued)

*Primary Examiner*—Minh Trinh
*Assistant Examiner*—Donghai D. Nguyen
(74) *Attorney, Agent, or Firm*—Nixon Peabody LLP; Donald R. Studebaker

(57) ABSTRACT

Disclosed is an electronic-component mounting apparatus 1 for mounting a plurality of electronic components onto a printed-wiring board 10, which comprises a component mounting head 4 adapted to suck up the electronic component and mount the sucked up electronic component on the printed-wiring board 10 while moving along an X-axis direction, a table 8 adapted to move the printed-wiring board 10 along a Y-axis direction, an electronic-component feeding device 12, 14 attached to the table 8 and adapted to move in sync with the movement of the printed-wiring board 10, and component image-recognition/correction means 16 for correcting a posture of the electronic component in accordance with image recognition of the posture, during the time between the sucking up and mounting of the electronic component by the component mounting head, wherein respective positions of the sucking of the electronic component, the mounting of the electronic component and the image recognition are located on the X-axis. The disclosed electronic-component feeding device includes a rectangular-pipe type and a plate type.

5 Claims, 25 Drawing Sheets

FOREIGN PATENT DOCUMENTS

| | | |
|---|---|---|
| JP | 07-030287 | 1/1995 |
| JP | 07-030292 | 1/1995 |
| JP | 07-061556 | 3/1995 |
| JP | 10-022688 | 1/1998 |
| JP | 10-294598 | 11/1998 |
| JP | 11-317599 | 11/1999 |

* cited by examiner

| | | | | | | |
|---|---|---|---|---|---|---|
| 8mm TAPE | 201 | 202 | 203 | 204 | | |
| 12mm TAPE | 205 | 206 | 207 | | | |
| 16mm TAPE | 208 | 209 | 210 | 211 | 212 | 213 |
| 24mm TAPE | 214 | 215 | | | | |
| 32mm TAPE | 216 | 217 | 218 | 219 | | |
| 44mm TAPE | 220 | 221 | | | | |

FIG.25
(A)
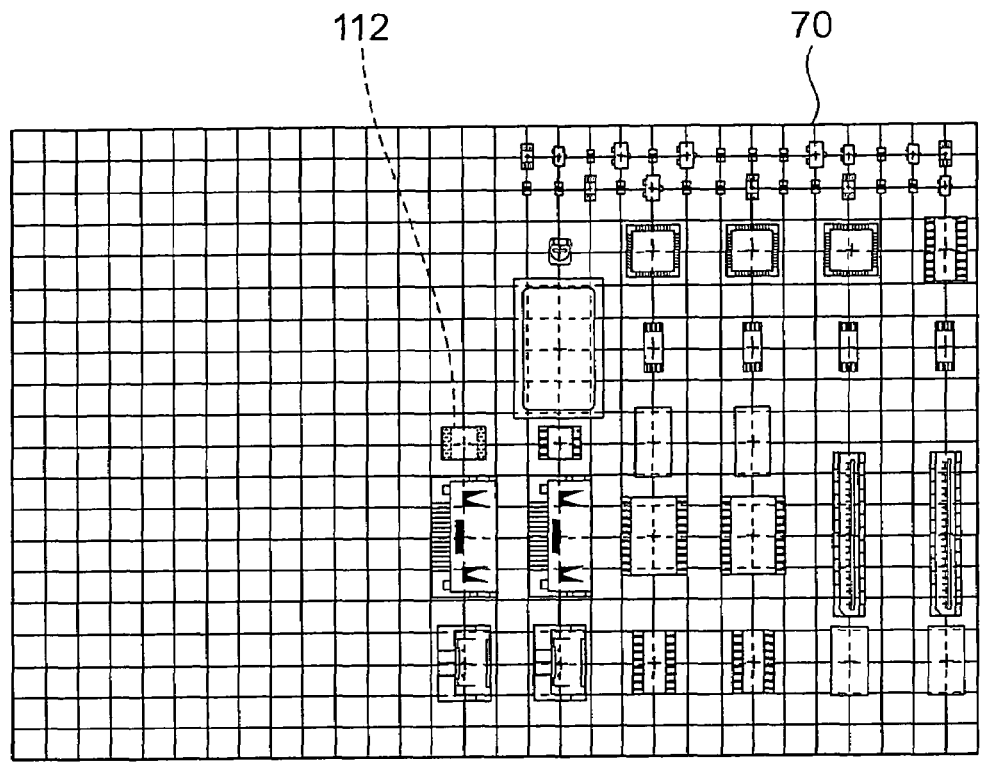
(B)
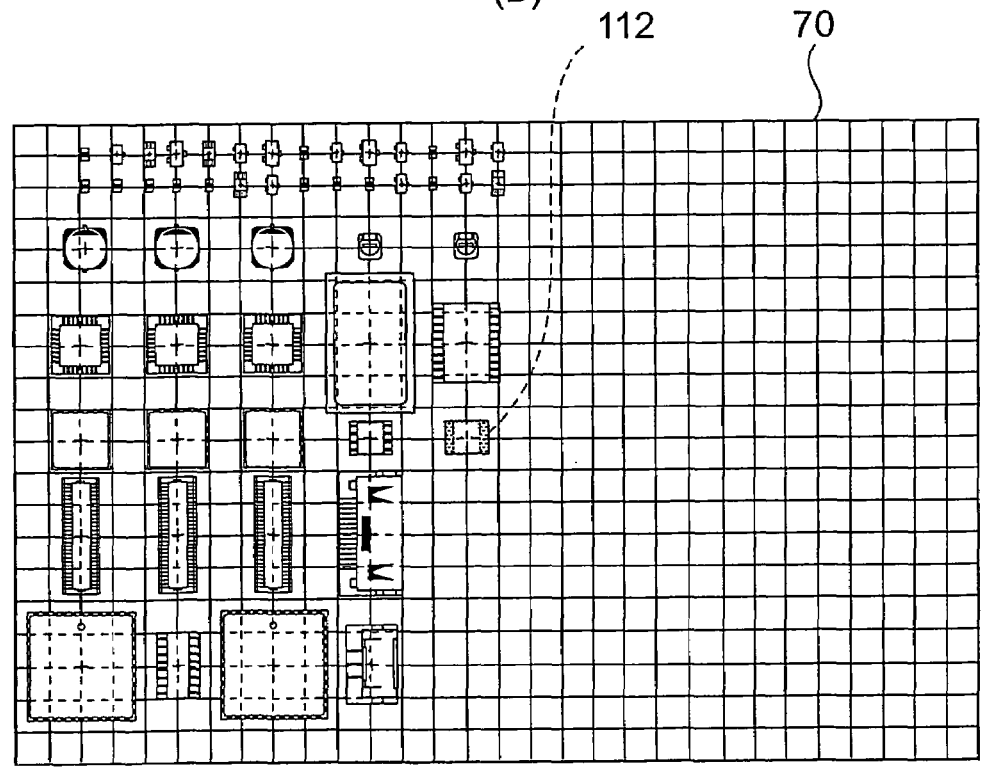

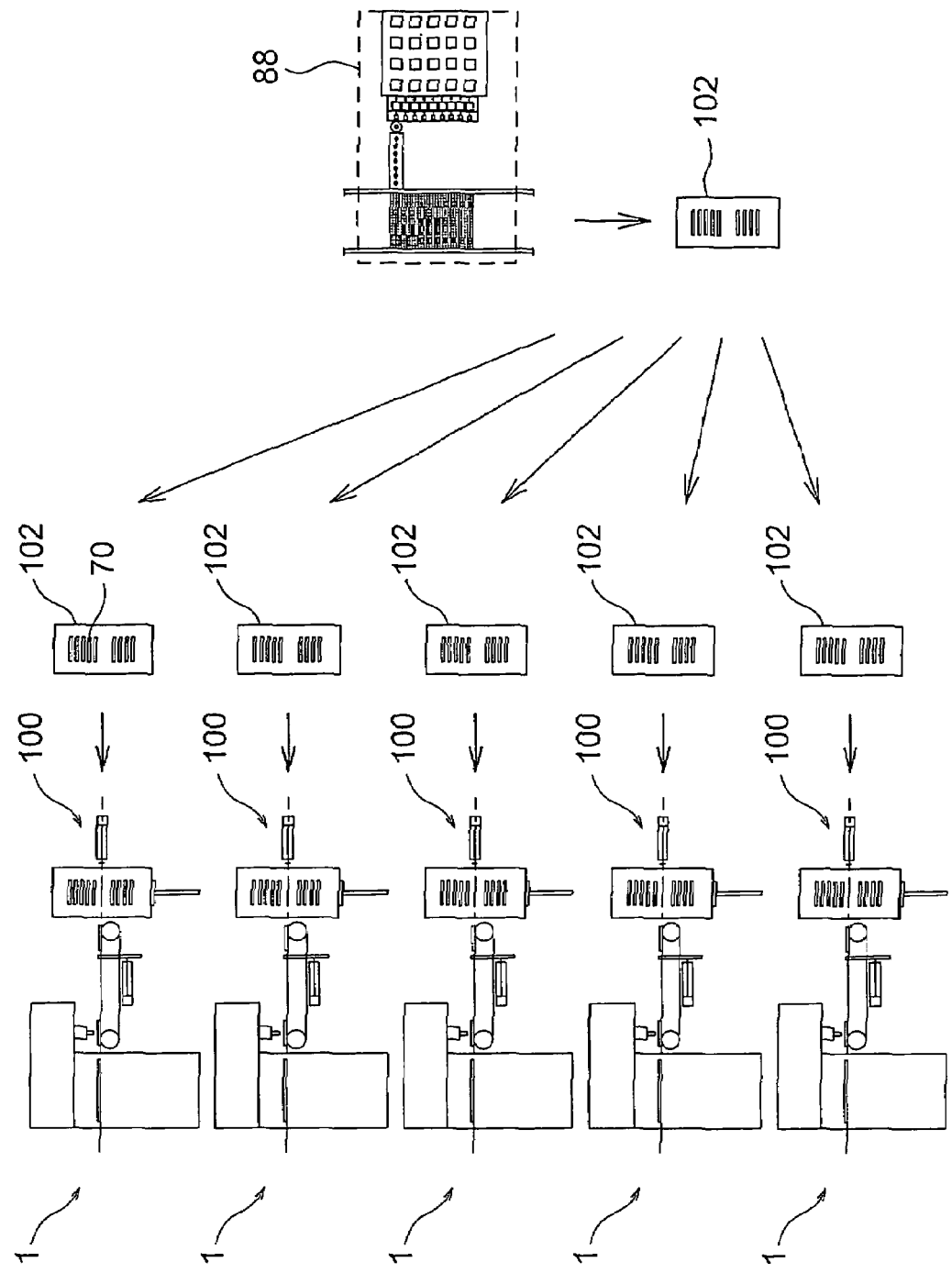

ELECTRONIC-COMPONENT FEEDING DEVICE

TECHNICAL FIELD

The present invention relates to techniques for automatically mounting electronic components, and more particularly to an electronic-component feeding device and an electronic-component mounting method suitable for a wide range of manufacturing environments from a high-mix low-volume manufacturing to a high-mix high-volume manufacturing.

BACKGROUND ART

Quite a number of electronic components are mounted on a printed-wiring board. Heretofore, in a process for mounting such electronic components on a printed-wiring board, an electronic-component automatic mounter has been used.

Most of the currently prevalent electronic-component automatic mounters have been developed with high-speed manufacturing in mind. Therefore, an electronic-component feeding device for use with the automatic mounter has also been developed with a view to automatically feed a large volume of electronic components, as a key function.

Among electronic components, a chip-type electronic component, such as a chip resistor or a chip capacitor which is a passive component, has the largest number of items or kinds thereof and a large quantity of them are used. The chip-type electronic component includes a wide variety of components, such as an inductor and a diode, and it is estimated that the production number of chip-type electronic components in the world including Japan reaches one trillion per year.

Currently, in a process for mounting the large volume and wide variety of chip-type electronic components on a printed-wiring board, most of the chip-type electronic components are packed onto a tape having a width of 8 mm (8-mm tape), and fed to an electronic-component automatic mounter through a tape feeder. The tape packed with the electronic components (hereinafter referred to as "component tape") is wound onto a reel, and one reel with a diameter of 180 mm contains about 5,000 to 10,000 of the components.

An electronic component other than the chip-type electronic components, for example, a large-size component, such as an IC and other semiconductor components, incapable of being packed onto the 8-mm tape, is packed onto a wider tape having a width, for example, of 12, 16, 24, 32 or 44 mm, and fed to an electronic-component automatic mounter through a tape feeder. In addition to the component tape-based feeding, some large-size electronic components, particularly ICs, are also packed onto a matrix tray and fed in the form of the tray packed with the electronic components (hereinafter referred to as "component tray").

The currently prevalent electronic-component automatic mounters can be roughly classified into the following two types: (1) a first type designed to pick up an electronic component at a fixed component feeding section, transfer the component to a given position where a printed-wiring board is fixedly positioned, and mount the electronic component on the printed-wiring board; and (2) a second type designed to rotate a turret at a fixed position so as to receive a given electronic component at a movable component feeding section, and mount the component on a printed-wiring board which is placed on an X-Y table and moved to a given position. That is, the second type is designed to perform simultaneous parallel operations of sucking (pickup) and mounting.

Both of the first and second types of electronic-component automatic mounters are combined with either one of the component tape-based feeding and the component tray-based feeding. Thus, in a process for mounting all of required electronic components using a single electronic-component automatic mounter, the mounter has to be combined with a number of tape feeders and/or a tray feeding device capable of feeding a number of component trays containing plural kinds of electronic components. This causes a problem in that there is an excessive increase in the area of a component feeding section, and a resulting excessive increase in the size and cost of the electronic component automatic mounter. Thus, it is often the case that the number of number of kinds of electronic components is minimized, and a plurality of electronic component automatic mounters are used in combination to complete a mounting operation for a single printed-wiring board.

As mentioned above, a mainstream technique for feeding electronic components to an electronic component automatic mounter is the component tape-based feeding, and other components incapable of using the component tape-based feeding are typically fed by the component tray-based feeding. Most of the component tapes and trays are fed to the mounter directly in the form of a packaging used for shipment/transport from a component supplier. For example, when chip-type electronic components are supplied in the form of the tape-and-reel packaging, about 5,000 components are contained in one reel. This reel is put on a tape feeder to feed the component tape to the mounter at high speed. Some electronic components are frequently used, that is, a few dozens are mounted per printed-wiring board, and some electronic components are less frequently used, that is, only one is mounted per printed-wiring board. If electronic components of which only one is to be mounted per printed-wiring board are fed by a reel containing 5,000 components, all the components in one reel will be consumed only after completion of a mounting operation for 5,000 printed-wiring boards. In contrast, a reel containing frequently-used components will be frequently replaced.

Similarly, electronic components to be fed by the component tray-based feeding are packed onto different trays depending on component suppliers and kinds of electronic components. In this case, electronic components are packed in each of the trays on a kind-by-kind basis. Thus, a tray feeding device for feeding such many kinds of electronic components is required to have a capacity of loading a number of component trays containing many kinds of electronic components. Specifically, the tray feeding device is designed to allow several dozens of different component trays to be loaded there into in a stacked manner and allow a required one of the electronic components in the trays to be picked up in a random manner.

The currently prevalent electronic-component automatic mounters are designed to automatically feed all kinds of components at high speed using the mainstream tape feeder and tray feeder, regardless of whether or not they are frequently used.

Thus, in the existing circumstances, when the currently prevalent electronic-component automatic mounter and electronic-component feeding device are used for mounting many kinds of electronic components on a small lot such as one to several lot manufacturing type of printed-wiring boards, the manufacturing is completed in a moment, after considerable time is spent on rearranging the electronic component feeding device, creation of a mounting program for the plurality of mounters, etc.

Currently, when many kinds of electronic components are mounted on a small lot such as one to several lot manufacturing type of printed-wiring boards, there are the following two cases: one where the components are manually mounted one-by-one while manually soldering them; the other where an existing high-volume manufacturing line is temporarily shifted to a low-volume manufacturing line. In the latter case, the printed-wiring board is apt to be manufactured in a number greater than a required number, and the extra printed-wiring boards will be stored for an upcoming manufacturing, because of an extremely short manufacturing time as compared to a fairly long setup time.

Further, in some cases, for the purpose of reducing a time needed for rearrangement of the electronic-component feeding device in the event of a setup operation, electronic components required for plural types of printed-circuit boards are pre-loaded onto the feeding device so as to allow required components to be fed simply by calling a corresponding software program, in the event of the setup operation. In this case, an extremely large number of electronic-component feeding devices have to be installed in an electronic-component automatic mounter. This often raises the need for providing a plural number of the mounters. The resulting manufacturing capacity is too high for mounting electronic components on the small-lot manufacturing type of printed-wiring board, and an extravagant amount of equipment investment is required.

Further, despite a current trend that the mounting for a large-volume manufacturing type of printed-wiring boards has been increasingly shifted to low-wage countries, and the fabrication of prototype boards and the mounting for a high-mix low-volume manufacturing type of printed-wiring boards has increased in developed countries, the establishment of a suitable manufacturing system for the current situation, or the development of an electronic-component feeding device and an automatic mounting apparatus for a high-mix low-volume manufacturing is still quite preliminary.

A mounting system suitable for a high-mix low-volume manufacturing is required to allow a setup operation to be completed in a short period of time. A mounting system comprising the currently prevalent electronic-component automatic mounter and electronic-component feeding device requires that a good deal of time be spent for a setup operation, such as rearrangement of the feeding device, and adjustment of balance in manufacturing volume between a plurality of the mounters and creation of a mounting optimization program. Further, in order to reduce a time needed for rearrangement of the feeding devices during a setup operation, electronic components required for plural types of printed-wiring boards are pre-loaded onto the feeding device to allow required components to be fed simply by calling a corresponding software program in the event of the setup operation, as described above, or each manufacturing line is fixedly used for a specific type of printed-wiring boards. In either case, an extravagant amount of equipment investment is required, and it cannot be said that the electronic components can be manufactured efficiently.

Among electronic components, most of the chip-type electronic components, such as a chip resistor and a chip capacitor which are passive components having the largest number of kinds thereof and a large quantity of which are used, are currently fed by an 8-mm tape feeder (electronic-component feeding device). In a process for feeding many kinds of electronic components, it is required to use a number of 8-mm tape feeders. If a number of currently-prevalent 8-mm tape feeders are installed in an electronic-component automatic mounter, a component feeding section will occupy a large area in the mounter. In an electronic-component automatic mounter having a fixed component feeding section, a distance which a mounting head is required to move to pick up the component is significantly increased. In an electronic-component automatic mounter having a movable component feeding section, a length of the component feeding section and a total installation space of the mounter are undesirably increased. The increase in size or length of electronic-component automatic mounter causes an increase in cost thereof. Moreover, the 8-mm tape feeder itself is costly, and thereby a total cost of the mounting system including the mounter and the large number of 8-mm tape feeders will be hugely increased. The 8-mm tape feeder also involves a problem that less-frequently-used chip-type electronic components are inevitably contained therein in an excessively large number.

Further, despite the advance in downsizing of electronic devices and printed-wiring boards, the size of the electronic-component automatic mounting apparatus cannot be reduced due to slow-up in downsizing of the electronic-component feeding device.

The component tape-based feeding involves various problems, such as difficulties in reducing a component cost due to the need for a taping process and a costly tap material; poor ability to feed less-frequently-used components due to the large number (about 5,000 to 10,000) of chip-type electronic components contained in one reel supplied in the form of a tape-and-reel packaging; adverse affects on environmental conservation due to the tape being scrapped after use while the reel is recyclable; high transport and storage costs due to the large size of the package for the reel; and occurrence of a defective solder joint in a high-density mounting due to paper fragments of a paper tape.

If less-frequently-used large-size components are fed to an electronic-component automatic mounter directly in the form of a packaging at a time of shipment from a component supplier, a component tape will cause a problem due to an excessively large number of electronic components contained therein, and a component tray will cause problems due to an excessive increase in the area occupied or space for installing a tray feeding device when a plurality of component trays are arranged parallel to each other on a plane surface, or complexity in structure and increase in cost when a plurality of different component trays are arranged in a stacked manner. In a process for feeding a high-mix low-volume manufacturing type of electronic components, many kinds of electronic components may be mixedly contained in a common tray and the component tray fed to a common component feeding section. However, this is impracticable, because a large number of different electronic components having various sizes can be contained in a common tray only if the tray has a number of pockets formed in conformity to the respective sizes of the electronic components.

While the electronic components may be manually arranged on a common tray, it is practically difficult to arrange without error the electronic components at their correct positions.

In the process for mixedly feeding many kinds of electronic components in the common component feeding section, it is necessary to provide a sequencer for picking up electronic components from a packaging shipped from a component supplier and rearranging the electronic components on the component feeding section in the order of mounting. However, the currently prevalent electronic-component feeding device has no electronic-component sequencer unit for this purpose.

In the process for mixedly feeding many kinds of electronic components arranged on the component plate in the order of mounting, if a failure of mounting one of the electronic components on a printed-wiring board occurs, the failed-to-be-mounted electronic component has to be re-fed to the mounter to complete the mounting for the printed-wiring board. Thus, it is necessary to establish a process for reliably re-feeding a non-sequenced electronic component corresponding to the sequenced and failed-to-be-mounted component, with a high degree of accuracy.

In a process for manually mounting electronic components on a printed-wiring board one-by-one, the electronic components are manually soldered while attaching them onto the printed-wiring board, in most cases. Despite of difficulties in obtaining stable quality, this process has been often used as a quick-fix solution for fabricating one to several printed-wiring circuit boards. However, an electronic component is apt to have a smaller size and a higher mounting density. For example, currently prevalent chip-type electronic components have a minimum size of 0.6 mm×0.3 mm. It is extremely difficult to anchor such a micro-size component with tweezers, and manually solder the component.

Moreover, in the high-density mounting process, a distance between adjacent electronic components is in the range of 0.1 to 0.2 mm, and thereby a manual mounting operation is attended with much difficulty. The number of high-density printed-wiring boards unsuitable for a manual mounting operation is increasing, and a manual mounting of electronic components is thus becoming more and more difficult.

In addition, while a complete operational manual and training for operators are essential to allow operators to mount without error many kinds of electronic components at their correct positions, the preparation of such a complete operational manual and the operator's training for fabricating one to several printed-wiring boards have not been done in the existing circumstances, and thereby it is difficult to ensure adequate quality.

Some electronic components having a junction formed in a back surface of a component package in a grid pattern, such as a CSP (Chip Scale Package) or a micro PGA (Pin Grid Array), cannot be manually soldered, and a multi-pin component, such as an IC, involves significant difficulty in being manually mounted with adequate accuracy. The number of electronic components unsuitable for a manual mounting operation is increasing.

Thus, in view of quality, it is optimal to perform a mounting operation using a fully automatic mounting apparatus. While the mounting apparatus may have a low mounting speed in a mounting process for a high-mix low-volume manufacturing-type of printed-wiring boards, it should be able to feed a low volume of many kinds of electronic components, and mount the components with a high degree of accuracy at a low cost.

While the manufacturing system using a plurality of mounters in combination can facilitate improving productivity, it involves a problem in that a long preparation time is needed for alternation of mounting programs for the plurality of mounters, rearrangement of a plurality of electronic-component feeding devices, and adjustment of a balance in manufacturing volume between the plurality of mounters, in the event of a setup operation. Thus, the current electronic component mounting line is suitable for a high-volume manufacturing, but not for a high-mix low-volume manufacturing.

If less frequently-used electronic components are fed to a plurality of mounters through tape feeders, an excessive number of stock electronic components is undesirably fed to a component feeding section in each of the mounters.

In a manufacturing system provided with a plurality of mounters associated with each other and with various related apparatuses, such as a solder cream printing machine and a reflow furnace, each of the mounters and related apparatuses cannot be operated with optimal efficiency due to an unbalance in manufacturing volume and manufacturing capacity between the mounters and related apparatuses. Moreover, there is a need for simultaneously setting up the associated mounters and related apparatuses in the event of a setup operation. Thus, this system is unsuitable for a high-mix manufacturing.

DISCLOSURE OF THE INVENTION

In view of the above circumstances, it is therefore an object of the present invention to provide an electronic-component feeding device and an electronic-component mounting method suitable for a wide range of manufacturing environments from a high-mix low-volume manufacturing to a high-mix high-volume manufacturing.

It is another object of the present invention to provide an electronic-component feeding device requiring a reduced installation space therefor.

It is yet another object of the present invention to provide an electronic-component feeding device capable reduced in size.

According to a first aspect of the present invention, there is provided an electronic-component feeding device for feeding a plurality of chip-type electronic components, which comprises a pipe group consisting of a plurality of rectangular pipes arranged in parallel and in a high density. Each of the rectangular pipes has an inner passage formed in conformity to an outer shape of the chip-type electronic component and to allow two or more of the chip-type electronic components to be aligned along the inner passage. The electronic-component feeding device further includes a component extraction portion formed in a first end of each rectangular pipe of the pipe group, and component feed means disposed at a second, opposite, end of each rectangular pipe of the pipe group, and adapted to feed the chip-type electronic component to a corresponding one of the component extraction portions.

The electronic-component feeding device set forth in the first aspect of the present invention may further include magnet means disposed adjacent to each of the component extraction portions, and adapted to hold the chip-type electronic component at a component extraction position.

In the electronic-component feeding device set forth in the first aspect of the present invention, the component feed means may include a hopper group consisting of a plurality of hoppers each connected to a corresponding one of the second ends of the rectangular pipes and adapted to store the chip-type electronic components in a bulk state, component supply means adapted to vertically move at least either one of the hopper group and each of the second ends of the rectangular pipes so as to supply the chip-type electronic components in the hopper group to each of the inner passages of the rectangular pipes, and shift means adapted to shift the chip-type electronic components in each of the inner passages of the rectangular pipes to a corresponding one of the component extraction portions.

Further, the shift means may be designed to supply positive-pressure air to the hopper group so as to shift the chip-type electronic components in each of the inner passages of the rectangular pipes to a corresponding one of the component extraction portions.

In the electronic-component feeding device set forth in the first aspect of the present invention, each of the rectangular pipes may be made of stainless steel or plastic material.

The electronic-component feeding device set forth in the first aspect of the present invention may include a plural number of the pipe groups vertically superimposed on each other.

In the electronic component feeding device set forth in the first aspect of the present invention, each of the rectangular pipes may be machined into a given shape in conformity to a shape of the chip-type electronic component and to allow only one of four side walls defining each of the second ends of the rectangular pipes to protrude relative to the remaining walls.

According to a second aspect of the present invention, there is provided an electronic-component feeding device for feeding a plurality of electronic components, which comprises a plate having a flat surface and a film formed on the flat surface of the plate. The film has a surface friction coefficient capable of holding the electronic components, or an adhesion capable of preventing a side slipping of the electronic components and allowing each of the electronic components to be readily released from the plate during an operation for sucking the electronic component. The plurality of electronic components includes plural kinds of electronic components. The plural kinds of electronic components are mixedly placed on the film of the plate, respectively, in given positions.

In the electronic component feeding device set forth in the second aspect of the present invention, both of the plate and the film may be transparent. In this case, the electronic-component feeding device may further include template means provided on a front or back surface of the plate to indicate a plurality of positioning locations for the respective electronic components, whereby each of the electronic components can be placed on a corresponding one of the positioning locations according to the template means.

According to a third aspect of the present invention, there is provided an electronic-component mounting method for use in an electronic-component mounting apparatus including the electronic-component feeding device set forth in the second aspect of the present invention, to mount plural kinds of electronic components on a printed-wiring board. The electronic-component mounting method comprises the steps of mixedly placing the plural kinds of electronic components on the plate, and mounting each of the electronic components mixedly placed on the plate on the printed-wiring board.

BRIEF DESCRIPTION OF DRAWINGS

FIGS. 25(A) is a top plan view showing a first plate in the event of a failure in an operation for mounting an electronic component on the plate.

FIG. 25(B) is a top plan view showing the state after completion of an operation for mounting electronic components on a next plate used in the event of a failure of mounting an electronic component.

FIG. 26 is a schematic diagram showing a process for supplying a plurality of plate type electronic-component feeding devices (plate feeders), respectively, to a plurality of electronic-component automatic mounting apparatus, based on a single electronic-component sequencer unit according to one embodiment of the present invention.

BEST MODE FOR CARRYING OUT THE INVENTION

With reference to the accompanying drawings, various embodiments of the present invention will now be described.

With reference to the accompanying drawings, various embodiments of the present invention will now be described.

Firstly, an electronic-component automatic mounting apparatus equipped with an electronic-component feeding device according to one embodiment of the present invention will be described with reference to FIGS. 1 and 2.

Figure 1:
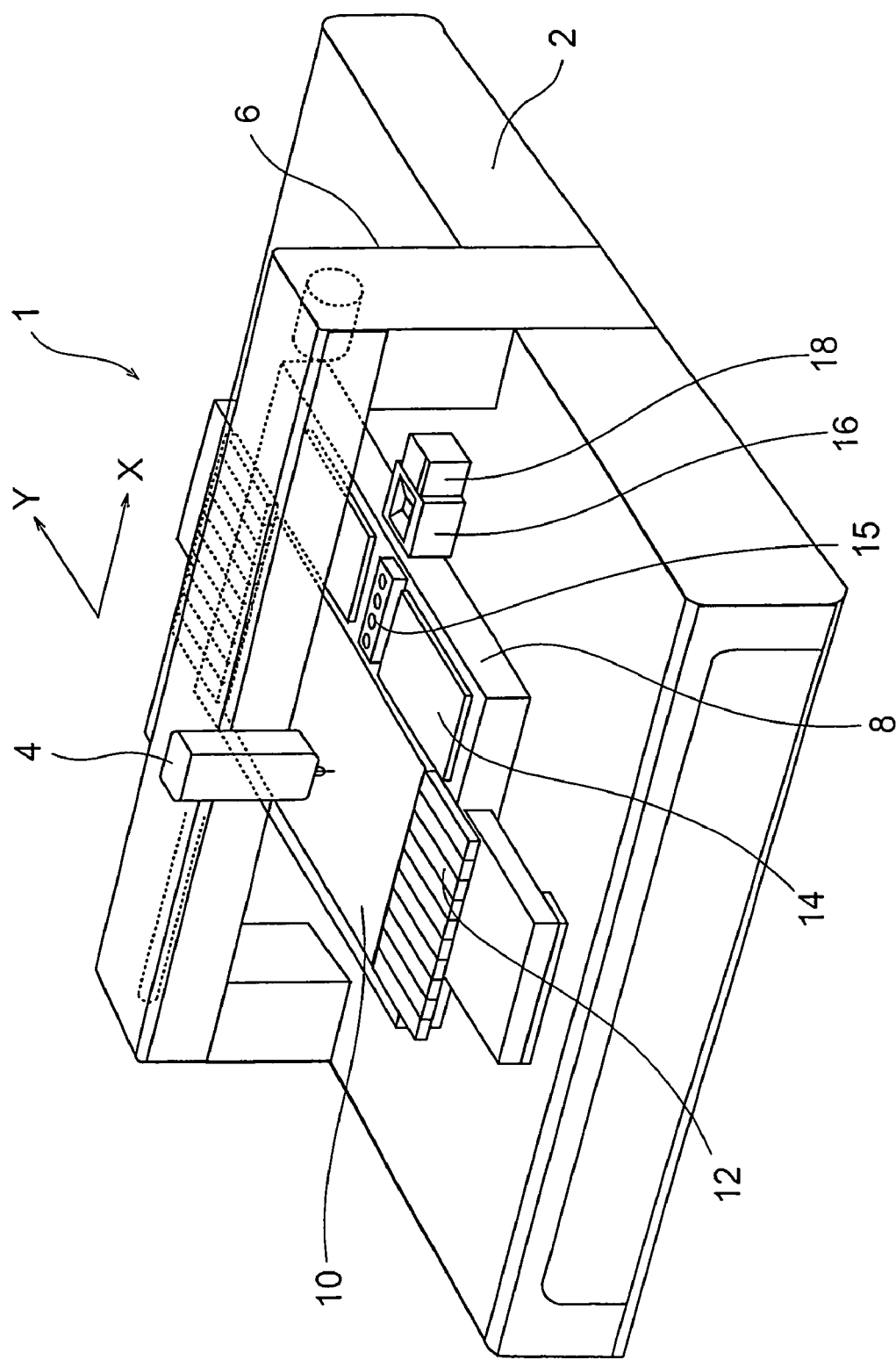
FIG. 1 is a perspective view generally showing an electronic-component automatic mounting apparatus equipped with a rectangular pipe type electronic-component feeding device according one embodiment of the present invention.
Figure 2:
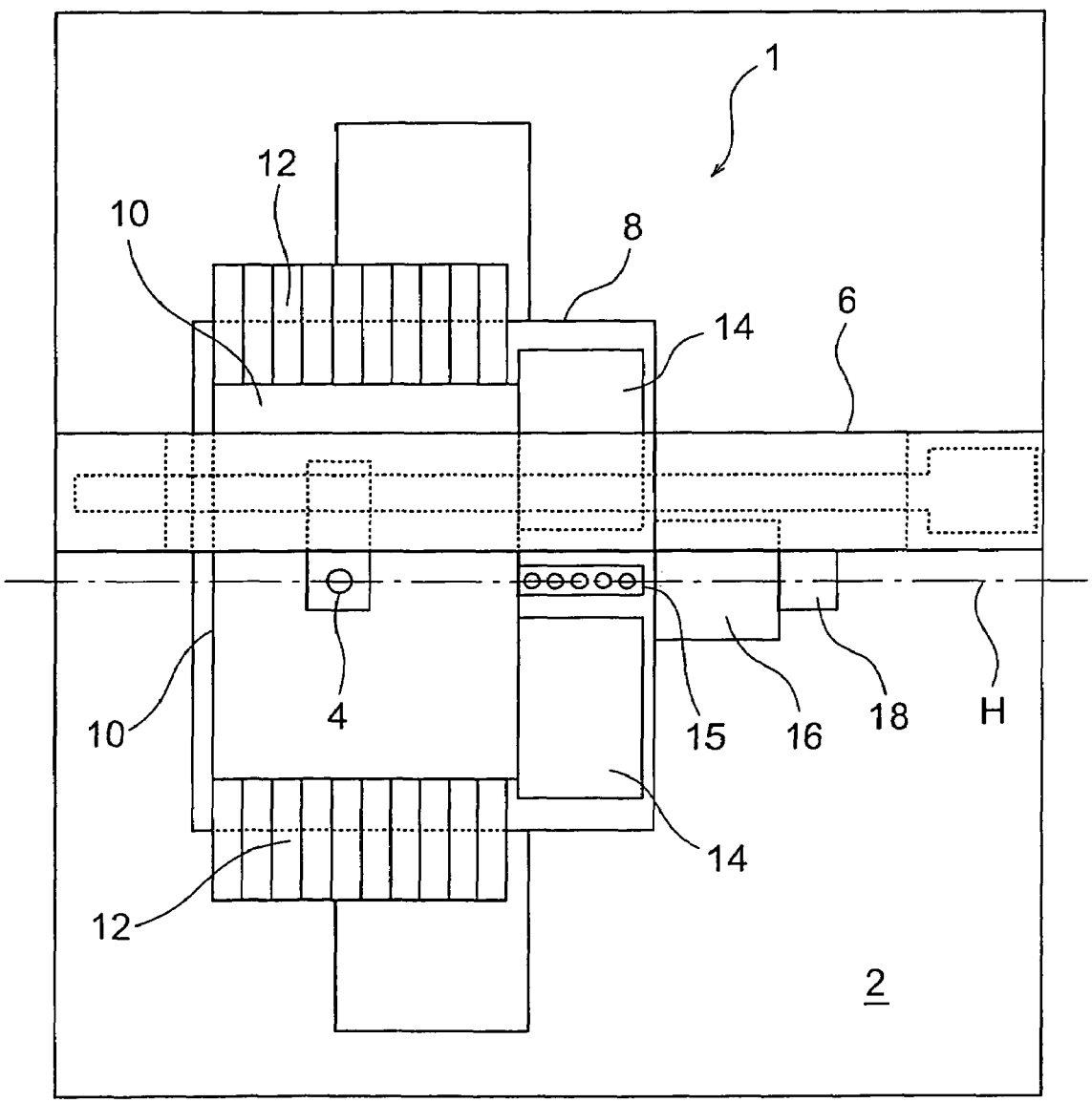
FIG. 2 is a top plan view generally showing the electronic-component automatic mounting apparatus in FIG. 1.

FIG. 1 is a perspective view generally showing the electronic-component automatic mounting apparatus, and FIG. 2 is a top plan view generally showing the electronic component automatic mounting apparatus.

As shown in FIGS. 1 and 2, the electronic component automatic mounting apparatus 1 has a base 2, and a columnar support member 6 is attached between opposite lateral ends of the base 2 at an approximately longitudinally central position thereof, in such a manner as to movably support a component mounting head 4. A printed-wiring board positioning table 8 is movably attached onto an approximately central region of a top surface of the base 2. A printed-wiring board 10 to be mounted with many kinds of electronic components is placed on the printed-wiring board positioning table 8 in a positioned manner.

The component mounting head 4 is designed to be controllably moved along an X-axis (first axis or lateral axis) direction, and the printed-wiring board positioning table 8 is designed to be controllably moved along a Y-axis (second axis or longitudinal axis) orthogonal to the X-axis (first axis).

An after-mentioned rectangular-pipe type electronic-component feeding device 12 is attached onto a top surface of the printed-wiring board positioning table 8. More specifically, two of the rectangular-pipe type electronic-component feeding devices 12 are located, respectively, on the sides of opposite Y-axial ends of the printed-wiring board 10.

An after-mentioned plate type electronic-component feeding device 14 is also attached onto the top surface of the printed-wiring board positioning table 8. More specifically, two of the plate type electronic-component feeding devices 14 are located, respectively, on the sides of opposite X-axial ends of the printed-wiring board 10.

Further, the printed-wiring board positioning table 8 is provided with a nozzle changer 15 having several kinds of component suction nozzles each having a size suitable for a corresponding electronic component. The nozzle changer 15 is designed to allow a component suction nozzle of the component mounting head 4 to be replaced with another component suction nozzle depending on sizes of electronic components.

When the printed-wiring board positioning table 8 is moved in the Y-axis direction, the rectangular-pipe type electronic-component feeding devices 12, the plate type electronic-component feeding devices 14 and the nozzle changer 15 can be moved together with or in concurrence with the printed-wiring board 10

Given that an axis parallel to the X-axis and along which the component mounting head 4 is moved is defined as a head movement axis H (see FIG. 1), an image recognition unit 16 is placed on the base 2 at a position located on the head movement axis H and adjacent to the printed-wiring board positioning table 8. The image recognition unit 16 is designed to image-recognize a position of an electronic component sucked by the component mounting head 4 during the course between respective operations for sucking and mounting the electronic component, so as to correct the position. Further, a disposer 18 is placed on the base 2 at a position located on the head movement axis H and next to the image recognition unit 16.

An operation of the electronic-component automatic mounting apparatus 1 will be described below. When the component mounting head 4 is moved in the X-axis direction in such a manner as to be located immediately above a component suction position where an electronic component fed by the rectangular-pipe type electronic-component feeding device 12 or the plate type electronic-component feeding device 14 and to be mounted on the printed-wiring board 10 is sucked and held by the component mounting head 4, the printed-wiring board positioning table 8 is simultaneously moved in the Y-axis direction. After sucking and holding the electronic component at the component suction position, the component mounting head 4 is moved along the head moving axis H up to the position of the image recognition unit 16, so that a position of the held electronic component is image-recognized and corrected by the image recognition unit 16. A positional correction of this electronic component in the X-axis direction and a θ rotational axis (rotational axis around a Z-axis perpendicular to the X-axis and Y-axis) direction is performed by adjusting a position of the component mounting head 4, and a positional correction of the electronic component in the Y-axis direction is performed by adjusting a position of the printed-wiring board positioning table 8.

In concurrence with the movement of the component mounting head 4 to the position of the image recognition unit 16, the table 8 is moved to a component mounting position, and stopped at the component mounting position after being subjected to the above positional correction in the Y-axis direction which results from the image recognition.

The component mounting head 4 mounts the held electronic component on the printed-wiring board 10 at the component mounting position. In this manner, the operation for moving the component mounting head 14 and the table 8 to suck and hold an electronic component, image-recognize and correct a position of a held electronic component, and mount the corrected electronic component will be repeatedly performed until all of required electronic components are completely mounted on the printed-wiring board 10.

In this electronic-component automatic mounting apparatus 1, all of the rectangular-pipe type electronic-component feeding devices 12 and the plate type electronic-component feeding devices 14 for feeding electronic components are attached onto the top surface of the printed-wiring board positioning table 8. This makes to possible to reduce a moving distance of the component mounting head 4. Thus, the electronic-component automatic mounting apparatus 1 can be suitably designed for a high-mix low-volume manufacturing, in a compact size and at a low cost.

A moving range of the component mounting head 4 may be slightly or appropriately extended to allow several kinds of tape feeders to be effectively incorporated in the electronic-component automatic mounting apparatus 1 so as to feed another type of electronic components incapable of placing on the table 8, such taped components packed in a component tape.

Now, with reference to FIGS. 3 to 14, a rectangular-pipe type electronic-component feeding device 12 according to one embodiment of the present invention will be described below.

Figure 3:
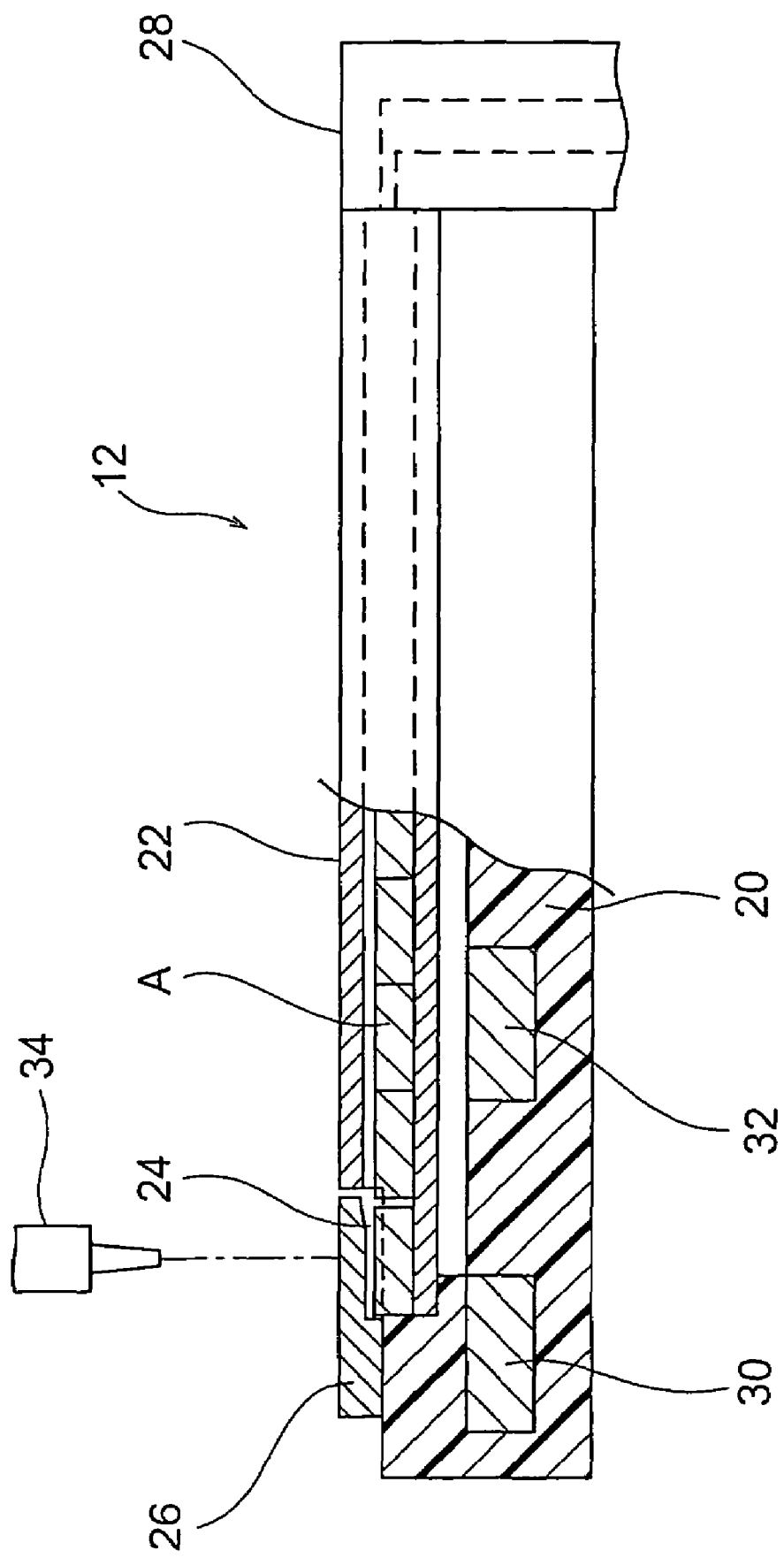
FIG. 3 is a side view showing a rectangular-pipe type electronic-component feeding device according one embodiment of the present invention.
Figure 4:
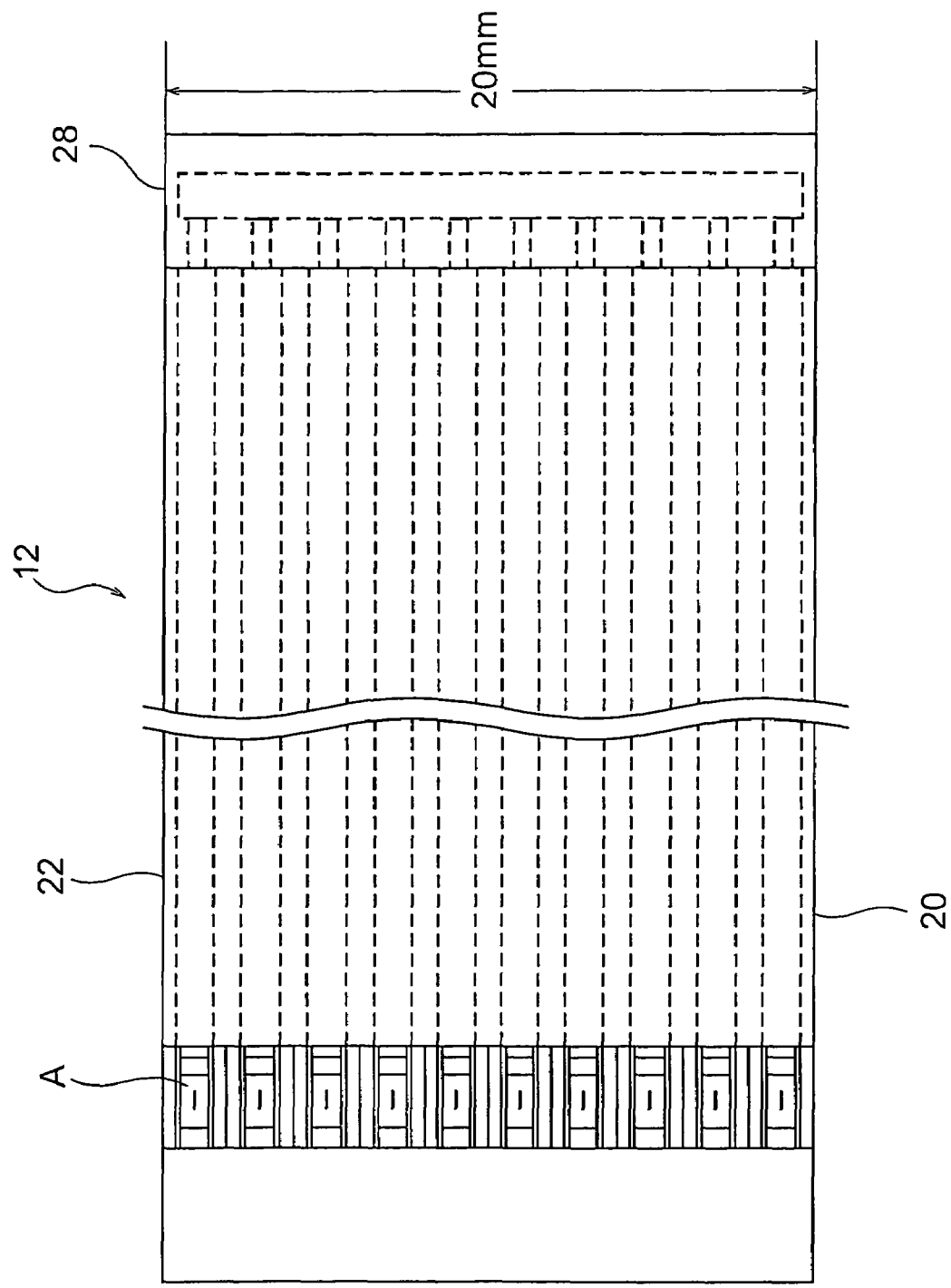
FIG. 4 is a top plan view showing the rectangular-pipe type electronic-component feeding device in FIG. 3.

FIGS. 3 and 4 are, respectively, a side view and a top plan view of the rectangular-pipe type electronic-component feeding device 12 according to the embodiment.

As shown in FIGS. 3 and 4, the rectangular-pipe type electronic-component feeding device 12 has a feeder base 20, and ten rectangular pipes 22 are detachably attached onto the feeder base 20 and arranged in a high density to form a pipe group. Each of the rectangular pipes 22 is an accurate stainless steel rectangular-shaped pipe prepared through a drawing process. The rectangular pipe 22 has an inner passage with a sectional shape formed in conformity to an outer shape of a chip-type electronic component A (hereinafter referred to occasionally as "chip component A") so as to receive therein two or more of the chip-type electronic components A in such a manner as to be aligned. This rectangular pipe 22 may be a stainless steel rectangular-shaped pipe prepared through a die forming process.

Alternatively, the rectangular pipe 22 may be a plastic rectangular-shaped pipe prepared through a drawing process, a die forming process or an extrusion process. When the rectangular pipe is made of plastic material, it is most preferable to prepare the rectangular pipe through an extrusion process.

Each of the rectangular pipes 22 has a front end (first end) formed with a chip component extraction port 24, and the extraction port 24 is covered by an openable/closeable or swingable shutter 26. Each of the rectangular pipes 22 also has a rear end (second end) provided with a component shifter 28 for intermittently supplying compressed air to the inner passage of the pipe 22 to shift the chip component A to the extraction port 24. This component shifter 28 is designed to be in fluid communication with all of the ten rectangular pipes, so that the component shifter 28 can shift the chip components in all of the ten rectangular pipes in a single unit. Instead of positive-pressure or compressed air, the chip components may be shifted by drawing them using negative-pressure or a vacuum. It is understood that both positive-pressure or compressed air and negative-pressure or a vacuum may be used in combination.

A first magnet 30 is disposed below the extraction port 24 and frontward relative to the extraction port 24 to stably hold a forefront or first chip component A, and a second magnet 32 is disposed below the extraction port 24 and rearward relative to the extraction port 24 to hold second and subsequent chip components A so as to prevent the first chip component A from being pushed from the rear side. A plurality of additional magnets (not shown) may be disposed along the inner passage of the rectangular pipe 22.

A pressure of the compressed air and a magnetic force of the magnets are adjusted to allow the chip component A to pass through the second magnet 32 against its magnetic force when the chip component A is shifted forward by the component shifter 28. While the shutter 26 is closed to prevent the first chip component A from getting out of the extraction port 24 when the chip components A are shifted frontward by compressed air, it is kept in an open state when no compressed air is supplied.

In an electronic component automatic mounting apparatus 1 (see FIG. 1), a nozzle 34 of a component mounting head 4 is designed to suck the first chip component A through the extraction port 24, transfer the sucked chip component A to a component mounting position of a printed-wiring board 10, and mount the chip component A on the printed-wiring board 10.

As described above, the rectangular pipe 22 is a stainless steel rectangular-shaped pipe prepared through a drawing or die-forming process, or a plastic rectangular-shaped pipe prepared through a die forming or extrusion process. Thus, the rectangular pipe 22 can be prepared in large numbers at low cost, and can be formed to have significantly small outside dimensions. For example, a chip resistor commonly known as a 1608 size chip resistor has outside dimensions of length L=1.6 mm, width W=0.8 mm, and height T=0.45 mm. A rectangular pipe 22 for this chip resistor has an inner peripheral size of width W=1.2 mm, and height T=0.6 mm, and an outer peripheral size of width W=1.66 mm, and height T=1.07 mm. A length of the rectangular pipe 22 may be set at any suitable value depending on a desired number of the chip components to be received therein.

The rectangular-pipe type electronic-component feeding device 12 illustrated in FIGS. 3 and 4 is prepared by attaching ten rectangular pipes 22 for 1608 size chip resistors to a feeder base 20 having a width of 20 mm.

Among conventional 8-mm tape feeders, a 20-mm width dual lane feeder designed to be loaded with two 8-mm tapes has a maximum density. The rectangular-pipe type electronic-component feeding device 12 has a density which is five times greater than that of the dual-lane feeder. In other words, the rectangular-pipe type electronic-component feeding device 12 can serve as a revolutionary electronic-component feeder capable of being incorporated into an electronic-component mounting apparatus five times the number of dual-lane feeders capable of being incorporated into the same electronic-component mounting apparatus. Further, the members required are only a plurality of rectangular pipes 22 or accuracy stainless steel rectangular-shaped pipes, and a single component shifter 28 for intermittently supply compressed air. Thus, the rectangular-pipe type electronic-component feeding device 12 can serve as a significantly low cost chip-component feeder. Furthermore, the rectangular-pipe type electronic-component feeding device 12 having no moving part has enhanced durability and easiness of maintenance.

Figure 5:
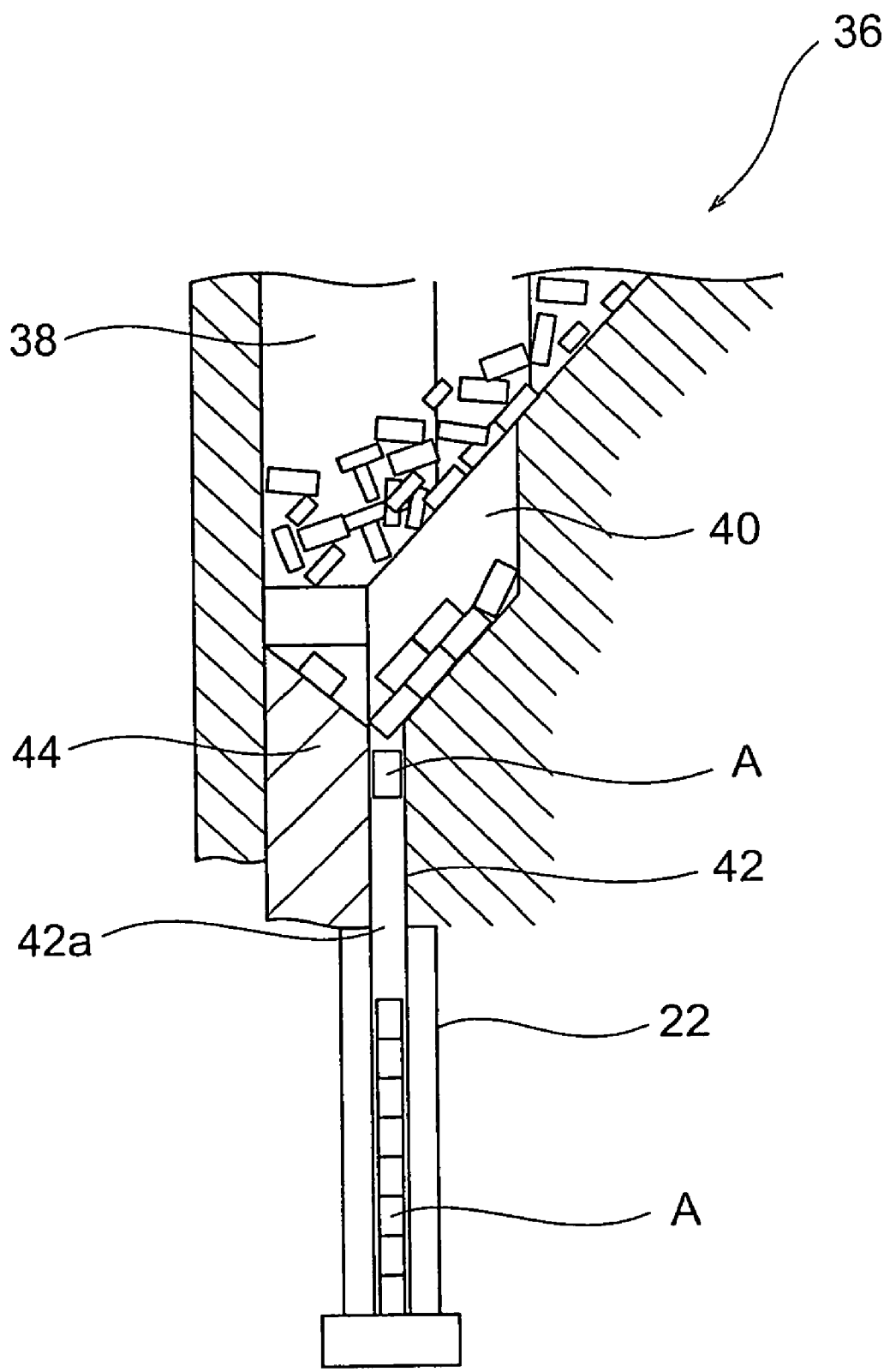
FIG. 5 is a sectional front view showing an aligning unit for aligning a plurality of chip-type electronic components in a bulk state, which is connected to a rectangular pipe in the rectangular pipe type electronic component feeding device in FIG. 3.
Figure 6:
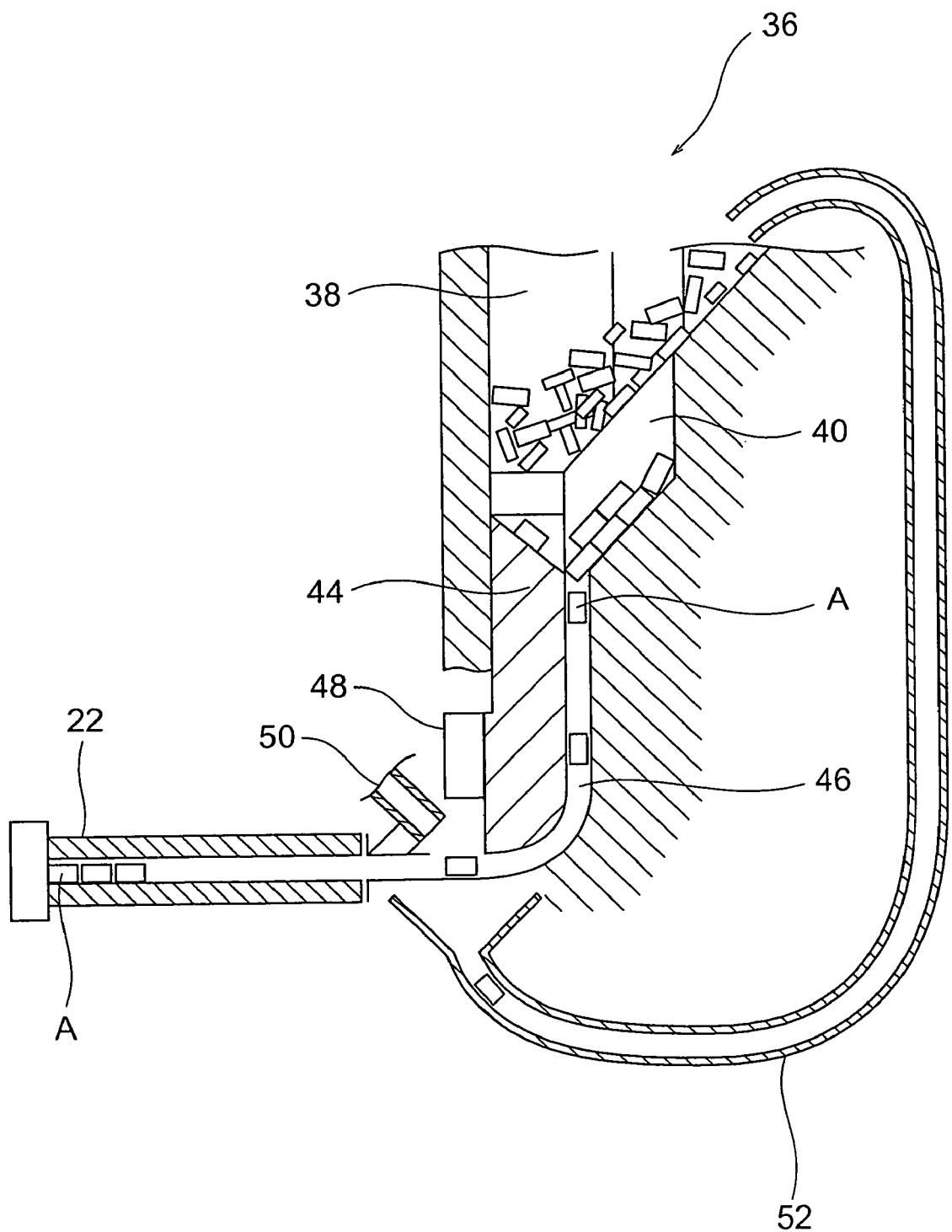
FIG. 6 is a sectional front view showing another aligning unit for discriminating between the obverse and reverse of each chip-type electronic component and aligning chip-type electronic components.
Figure 7:
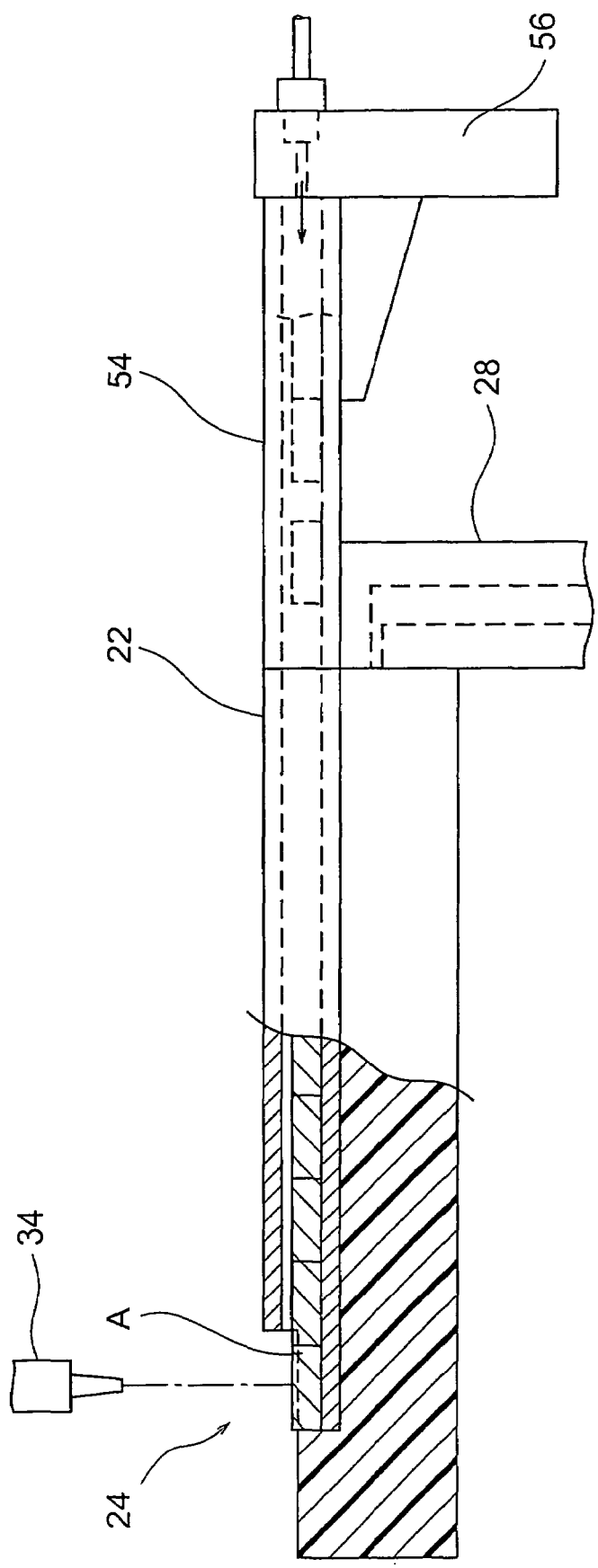
FIG. 7 is a side view showing the rectangular-pipe type electronic-component feeding device in the state when a chip-type electronic component is resupplied using a resupply rectangular pipe.

With reference to FIGS. 5 to 7, an aligning unit for aligning a plurality of chip-type components in a bulk state and then loading the rectangular pipes with the chip-type components will be described below.

FIG. 5 is a sectional front view showing the aligning unit connected to the rectangular pipe of the rectangular-pipe type electronic-component feeding device.

As shown in FIG. 5, the aligning unit 36 comprises a hopper 38 storing a number of chip-type electronic components A in a bulk state, an aligning chamber 40 located below the hopper 38 and formed to have the same thickness as that of the chip component A, an outlet passage 42 located below the aligning chamber 40 and formed to have a section in conformity with a sectional shape of the chip components A, and an aligning plate 44. The aligning plate 44 is designed to be vertically moved in a space between the hopper 38 and the aligning chamber 40 to stir the chip components A in a bulk state within the hopper 38 and aligned the chip components A, and guide the aligned chip components A from the aligning chamber 40 to the outlet passage 42. The rectangular pipe 22 is connected to a lower end of the outlet passage 42.

As shown in FIG. 5, the chip components A aligned by the vertical movement of the aligning plate 44 is guided by the outlet passage 42, and supplied from the outlet 42a to the inner passage of the rectangular pipe 22 connected to the outlet 42a, so that the chip components A are aligned in the inner passage of the rectangular pipe 22 in a line.

This aligning unit 36 is designed based on a part of the structure of a chip-component feeder disclosed in Japanese Patent Laid-Open Publication No. 10-294598, and thus its detailed description will be omitted.

In place of the aforementioned structure, the aligning unit may have any other suitable structure, such as a ball vibration feeder-based structure designed to align a plurality of chip components and supply the aligned chip components to the rectangular pipe by use of a ball vibration feeder.

With reference to FIG. 6, another aligning unit to be used when it is necessary to discriminate between the obverse and reverse of each chip component, such chip resistors, will be described below. In FIG. 6, the same components or elements as those at in FIG. 5 are defined by the same reference numerals, and thus their descriptions will be omitted. Thus, the following descriptions will be made only about components which are different.

As shown in FIG. 6, in addition to the structure illustrated in FIG. 5, an aligning unit 36 further comprises an outlet passage 46 curved from a vertical direction to a horizontal direction at 90 degrees, an obverse/reverse discrimination sensor 48 disposed at an outlet end of the outlet passage 46 and adapted to discriminate between the obverse and reverse of each chip component, an air blower 50 for blowing out a reverse chip component from the outlet passage 46, and a collection passage 52 for collecting the chip component blown by the air blower 50 and returning the chip component to the hopper 38.

In this aligning unit 36, a chip component guided to the outlet passage 46 is shifted by vibration toward the rectangular pipe 22 disposed to extend in a horizontal direction. Before reaching the rectangular pipe 22, the obverse/reverse sensor 48 discriminates between the obverse and reverse of each chip component. Then, according to the discrimination result, only an obverse chip component is allowed to pass through the pipe 22 to prevent obverse and reverse chip components from being mixed. Further, a reverse chip component is blown out of the outlet passage by the air blower 50, and returned to the hopper 38 through the collection passage 38.

In this manner, only obverse chip components are guided to the rectangular pipe 22 to prevent the rectangular pipe 22 from mixedly having both obverse and reverse chip components. After being filled with the chip components, the rectangular pipe 22 is separated from the aligning unit 36, and an empty rectangular pipe 22 the rectangular-pipe type electronic-component feeding device 12 is replaced with the rectangular pipe 22 filled with the chip components.

After discriminating between the obverse and reverse by the sensor, the obverse and reverse chip components may be separated by switching between two passages (not shown), and supplied, respectively, to two rectangular pipes (not shown). Alternatively, after discriminating between the obverse and reverse by the sensor, one of the obverse and reverse chip components may be reversed to allow all of the chip components to have obverse or reverse, and then supplied to a rectangular pipe. Further, instead of vibration, chip components may be supplied using a compressed air pressure or a vacuum suction.

As shown in FIG. 7, the aligning unit as shown in FIGS. 5 and 6 may be used for supplying chip components to a resupply rectangular pipe 54. In this case, after the component shifter 28 disposed at the rear end of the rectangular pipe 22 having no or only a few chip components in the rectangular-pipe type electronic-component feeding device 12 is detached, the resupply rectangular pipe 54 is connected to the rectangular pipe 22. Then, compressed air is supplied from the rear end of the resupply rectangular pipe 54 to resupply the chip components to the rectangular pipe 22.

Further, a given number of chip components may be filled in a resupply rectangular pipe 54 to sell the chip components using the re-supply rectangular pipe 54 itself filled with the chip components as the distribution medium. This method can fulfill a demand of customers intending to purchase a small number of chip components.

Figure 8:
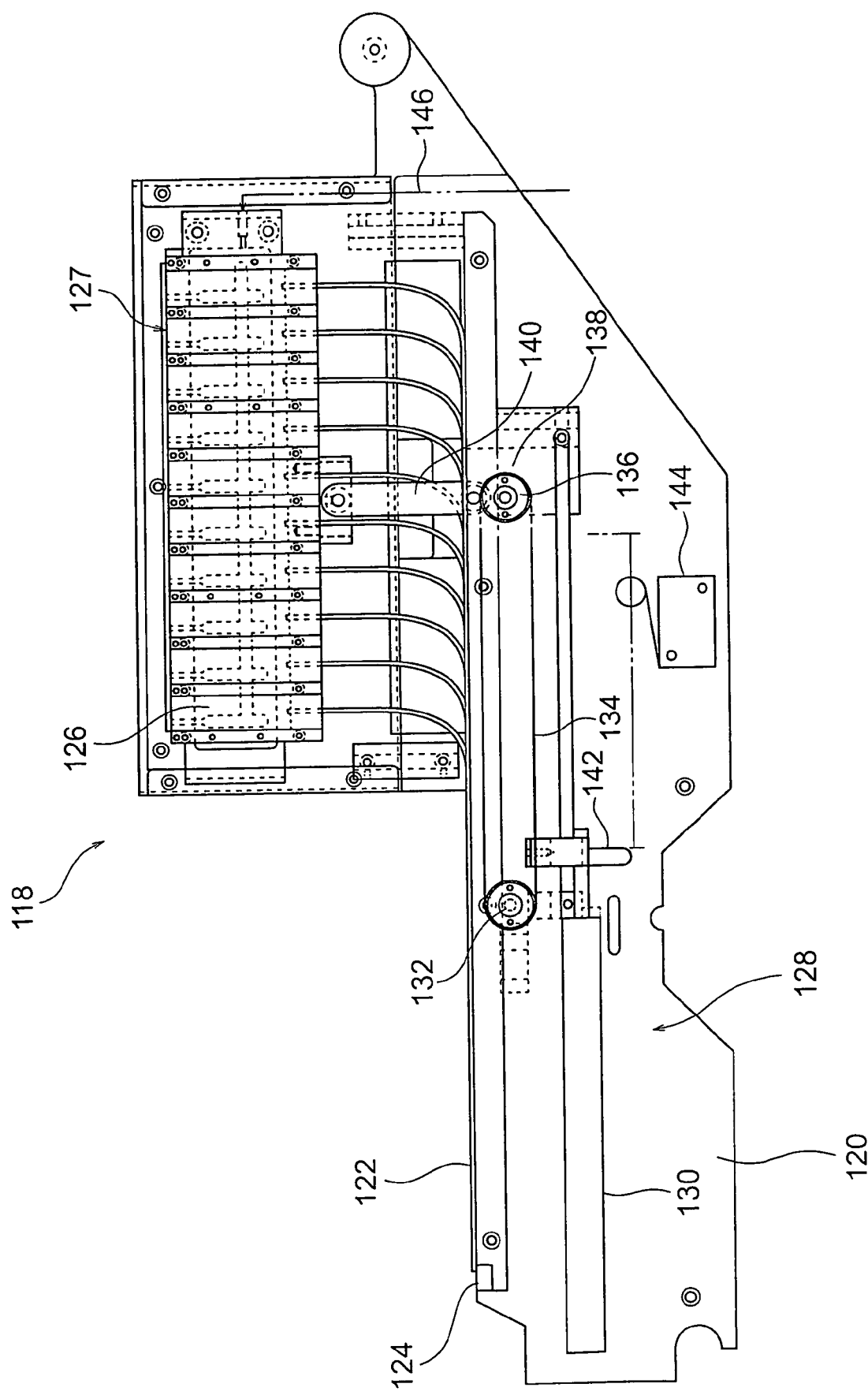
FIG. 8 is a side view showing a rectangular-pipe type electronic-component feeding device according another embodiment of the present invention.
Figure 9:
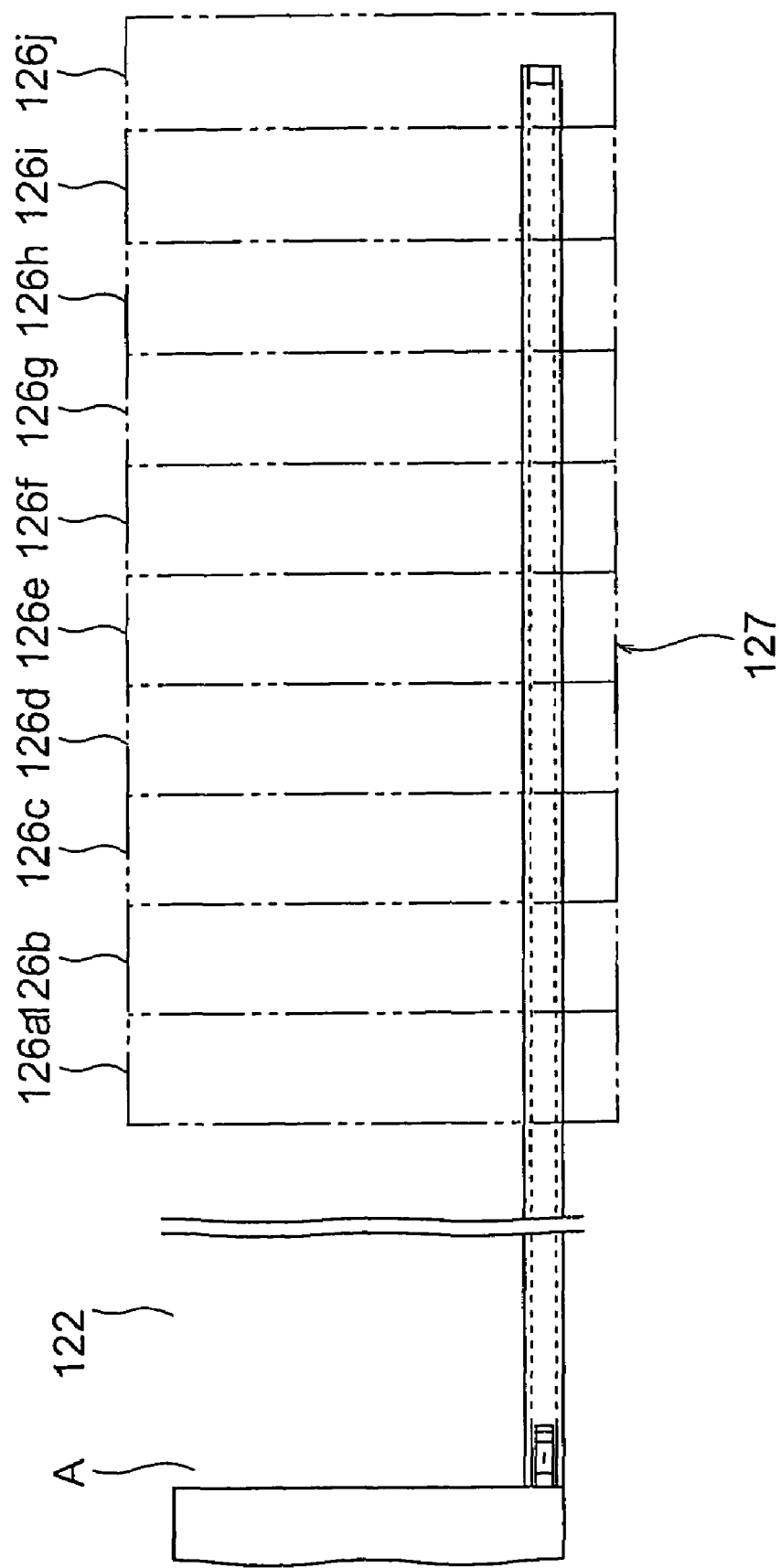
FIG. 9 is a top plan view showing the rectangular-pipe type electronic-component feeding device according the second embodiment.
Figure 10:
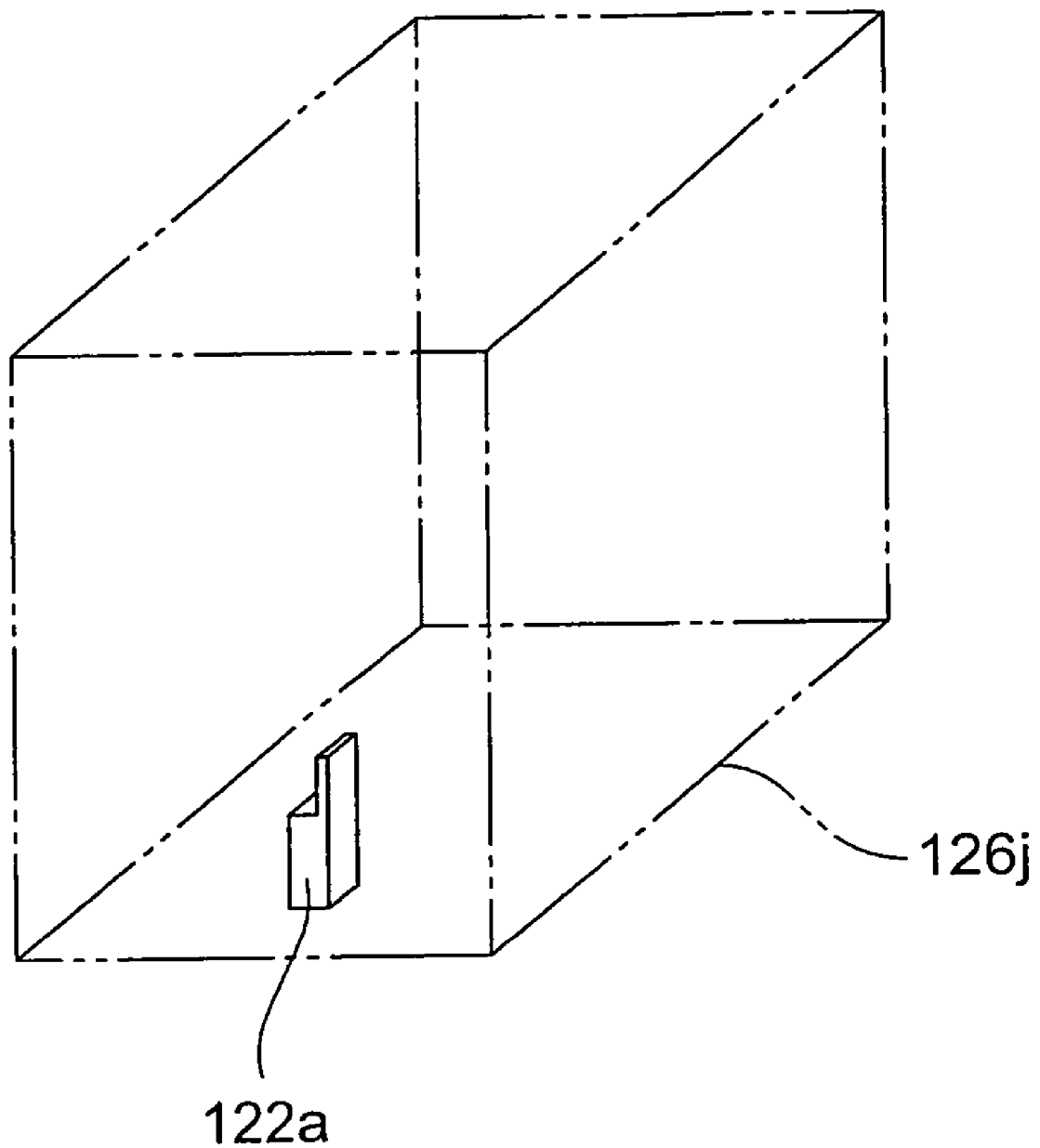
FIG. 10 is a perspective view showing one hopper in the rectangular-pipe type electronic-component feeding device in FIG. 8.

With reference to FIGS. 8 to 10, a rectangular-pipe type electronic-component feeding device according to another embodiment of the present invention will be described below. FIG. 8 is a side view showing the rectangular-pipe type electronic-component feeding device according to this embodiment, and FIG. 9 is a top plan view showing the rectangular-pipe type electronic-component feeding device. FIG. 10 is a perspective view showing one hopper in the rectangular-pipe type electronic-component feeding device in FIG. 8. In this embodiment, a hopper-type component supply unit is connected to a rear or second end of a rectangular pipe to supply chip components to an inner passage of the rectangular pipe.

As shown in FIG. 9, the rectangular-pipe type electronic-component feeding device 118 has a feeder base 120, and ten rectangular pipes 122 are detachably attached onto the feeder base 120 and arranged in a high density to form a pipe group. Each of the rectangular pipes 122 is an accurate stainless steel rectangular-shaped pipe prepared through a drawing process. The rectangular pipe 122 has an inner passage with a sectional shape formed in conformity to an outer shape of a chip-type electronic component A (hereinafter referred to occasionally as "chip component A") so as to receive therein two or more of the chip-type electronic components A in such a manner as to be aligned. This rectangular pipe 122 may be a stainless steel rectangular-shaped pipe prepared through a die forming process, or may be a plastic rectangular-shaped pipe prepared through a drawing process, a die forming process or an extrusion process.

Each of the rectangular pipes 122 has a front end (first end) formed with a chip-component extraction port 124, and a rear end (second end) bent upward at about 90 degree. A plurality of hoppers 126 storing a number of chip-type electronic components in a bulk state are connected, respectively, to the rear ends (second ends) of the rectangular pipes 122. Specifically, as shown in FIG. 9, ten of the hoppers 126 (126a to 126j) forming a hopper group 127 are connected, respectively, to ten of the rectangular pipes 122.

The ten hoppers 126 (126a to 126j) are designed to be vertically moved by a single hopper drive mechanism 128 to introduce (supply) the chip components A in the hopper 126 into the inner passage of the rectangular pipe 122.

The hopper drive mechanism 128 comprises a driving cylinder 130 adapted to perform one cycle of a reciprocating motion per operation, and a first pulley 132 connected to the driving cylinder 130, a timing belt 134 adapted to be moved by the first pulley 132, a second pulley 136 adapted to be rotated by the timing belt 134, a circular disc 138 coaxially attached to the second pulley 136, and a driving bar 140 having one end attached to the circular disk 138 and the other end attached to the hopper group 127 to form a crank mechanism.

In conjunction with the reciprocating motion of the driving cylinder 130, the second pulley 136 and the circular disk 138 are rotated by the rotation of the first pulley 132 and the timing belt 134. Thus, the driving bar 140 is vertically moved, and the hopper group 127 or the ten hoppers 26 are vertically moved. In this manner, the chip components A in the hoppers are introduced (supplied) to the inner passages of the corresponding rectangular pipes 122.

The timing belt 134 is provided with an actuator 142 adapted to be reciprocated together with the timing belt 134 so as to turn on and off an air switch 144. When the air switch 144 is in its ON state, compressed air (positive-pressure air) 146 is intermittently supplied from a compressed air source (not shown), and the chip components A aligned in each of the inner passages of the rectangular pipes are shifted to the chip-component extraction port 124. In the process, compressed air is supplied to all of the ten hoppers 126 and the ten stick-shaped pipes 122. That is, the chip components A can be shifted in all of the ten rectangular pipes 122 by supplying compressed air only once.

As show in FIG. 10, each of the hoppers 126 has a flat bottom surface. Further, in order to facilitate introducing the chip component A into each second end 122a (top end) of the rectangular pipes 122 inserted into the corresponding hoppers 126, the second end 122a is machined into a given shape in conformity to a shape of the chip component, and formed to allow only one of four side walls defining the second end 122a to protrude upward relative to the remaining side walls.

While the rectangular-pipe type electronic-component feeding device illustrated in FIGS. 8 to 10 is designed to vertically move the hopper group 127 by the hopper drive mechanism 28 so as to introduce (supply) the chip components A in the hoppers 26 to the inner passages of the corresponding rectangular pipes 122, the hopper group 127 may be fixed without vertical movement, and a second-end drive mechanism for driving the second ends of the rectangular pipes may be provided. In this case, the second-end drive mechanism may be designed to elastically deform the second ends of the rectangular pipes 122 so as to vertically move them.

Instead of positive pressure or compressed air as a power source for shifting the chip components, the chip components may be shifted by drawing them using negative pressure or a vacuum. It is understood that both positive pressure or compressed air and negative pressure or a vacuum may be used in combination.

Figure 11:
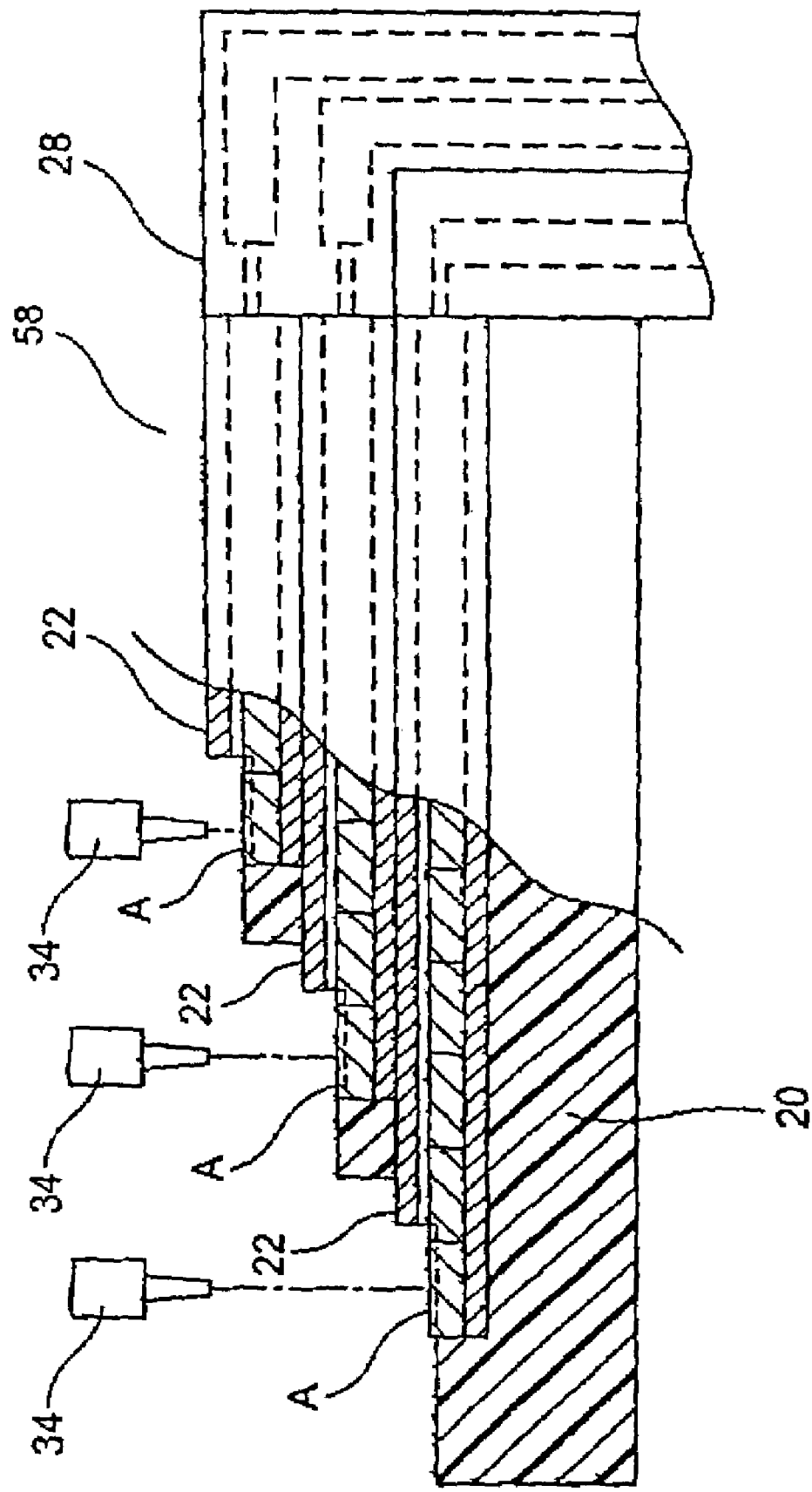
FIG. 11 is a side view showing a rectangular-pipe type electronic-component feeding device according yet another embodiment of the present invention.

With reference to FIG. 11, a rectangular-pipe type electronic-component feeding device according to another embodiment of the present invention will be described below. While the rectangular-pipe type electronic-component feeding device illustrated in FIGS. 3 and 4 has a single-story structure with a single pipe group consisting of ten rectangular pipes, the rectangular-pipe type electronic-component feeding device 58 according to this embodiment illustrated in FIG. 11 has a multistory structure formed by vertically superimposing three of the pipe groups consisting of ten rectangular pipes.

This multistory rectangular-pipe type electronic-component feeding device 58 also has a single feeder base 20, and thirty rectangular pipes 22 are detachably attached onto the feeder base 20. Further, a component shifter 28 is attached to each of the stories or pipe groups. Alternatively, the component shifter 28 may be a single unit designed to be in fluid communication with all of the thirty rectangular pipes 22.

As illustrated in FIG. 11, a component mounting head 4 may have three nozzles 34 to suck the chip components from the corresponding stories or pipe groups, or may have a single nozzle designed to be vertically moved so as to suck the chip component in each of the stories or pipe groups.

A shutter 26 and two magnets 30, 32 not shown in FIG. 11 may be provided to each of the stories or pipe groups.

A plural number of the pipe groups can be superimposed on each other as in the embodiment illustrated in FIG. 11 to serve as an electronic-component feeder capable of feeding chip components in a high density which is several dozen times greater than that of the conventional tape feeder, but having the same space. As to chip components of other sizes, a high-density feeding can also be achieved. For example, twelve of the electronic-component feeding devices can be incorporated in a 20-mm width feeder base for a 1005-size (L=1.0 mm, W=0.5) chip component, and twenty of the electronic-component feeding devices can be incorporated in the 20-mm width feeder base for a 0603-size (L=0.6 mm, W=0.3) chip component. Thus, chip components can be fed in a high density and the number of kinds fed is several dozen times greater than that fed by the currently prevalent 8-mm tape feeder. This makes it possible to feed many kinds of chip components by only a single mounting s apparatus.

If it is required to feed chip components at high speed, the same kind of chip components may be contained in a plurality of rectangular pipes, and extracted or picked up from the rectangular pipes to achieve a high-speed feeding. For example, given that ten sticks or rectangular pipes are attached to a 20-mm width feeder base, and all of the sticks contain the same kind of chip components, for example 1608-size chip registers having the same resistance, the chip components may be sequentially extracted or picked up from the ten sticks, and then chip components for the ten sticks may be shifted by the component shifter 28.

When it is compared to a high-speed feeding for an 8-mm tape feeder, the 8-mm tape feeder is required to peel a cover tape while indexedly feeding the tape using an indexed wheel, and pick up a chip component just after the tape is stopped. Ten of the chip components can be fed only after this operation is repeated ten times. In the rectangular-pipe type electronic-component feeding device according to this embodiment, ten of the sticks are aligned within a width of 20 mm equal to that of the tape feeder, without any high-speed moving part, and ten chip components stand ready to be picked up or extracted, respectively, at the ten chip-component extraction ports. In view of a high-speed feeding, this is advantageous as compared to the 8-mm tape feeder.

Figure 12:
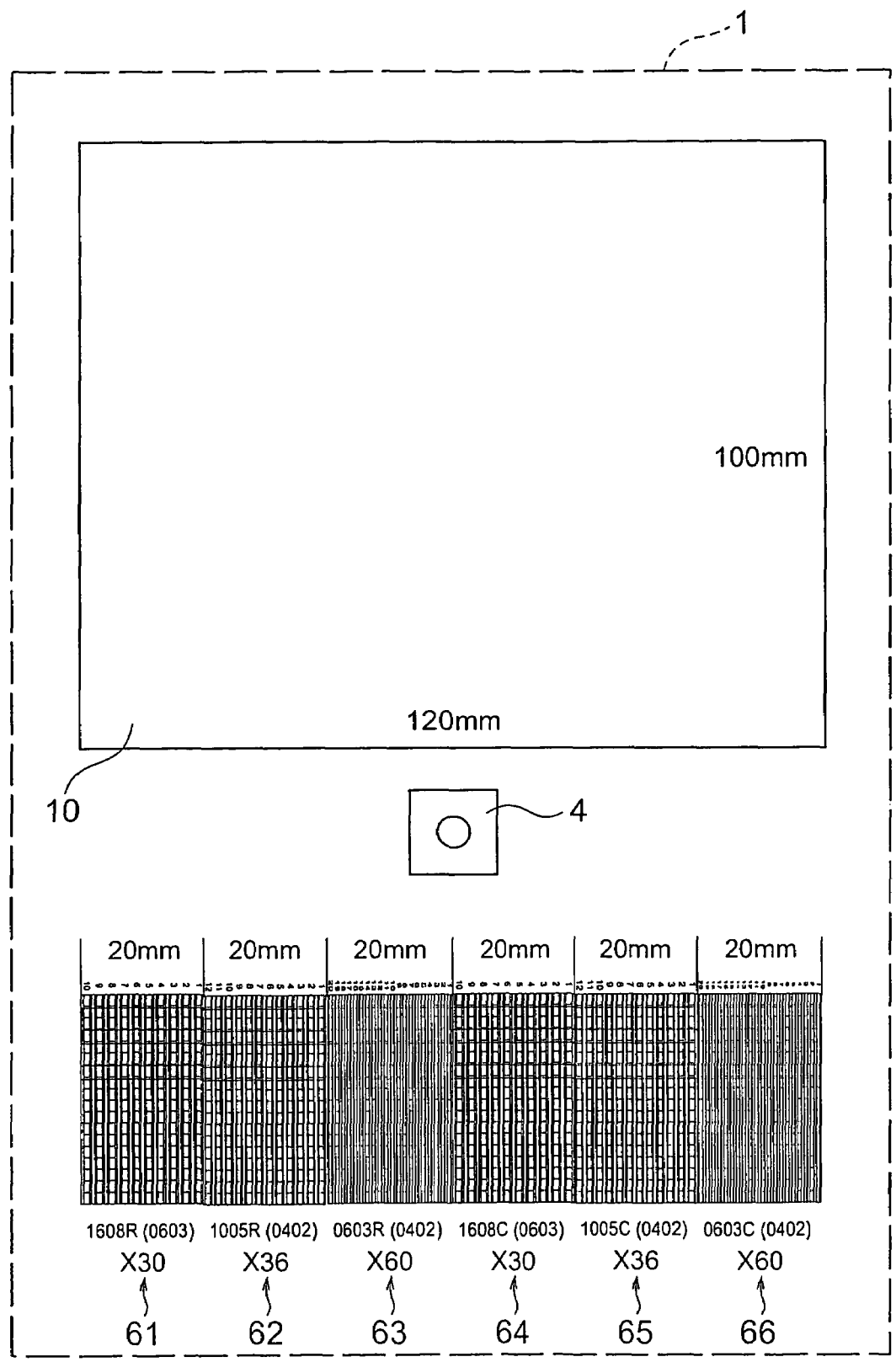
FIG. 12 is a schematic top plan view showing an electronic-component automatic mounting apparatus equipped with a rectangular-pipe type electronic-component feeding device according to one embodiment of the present invention.
Figure 13:
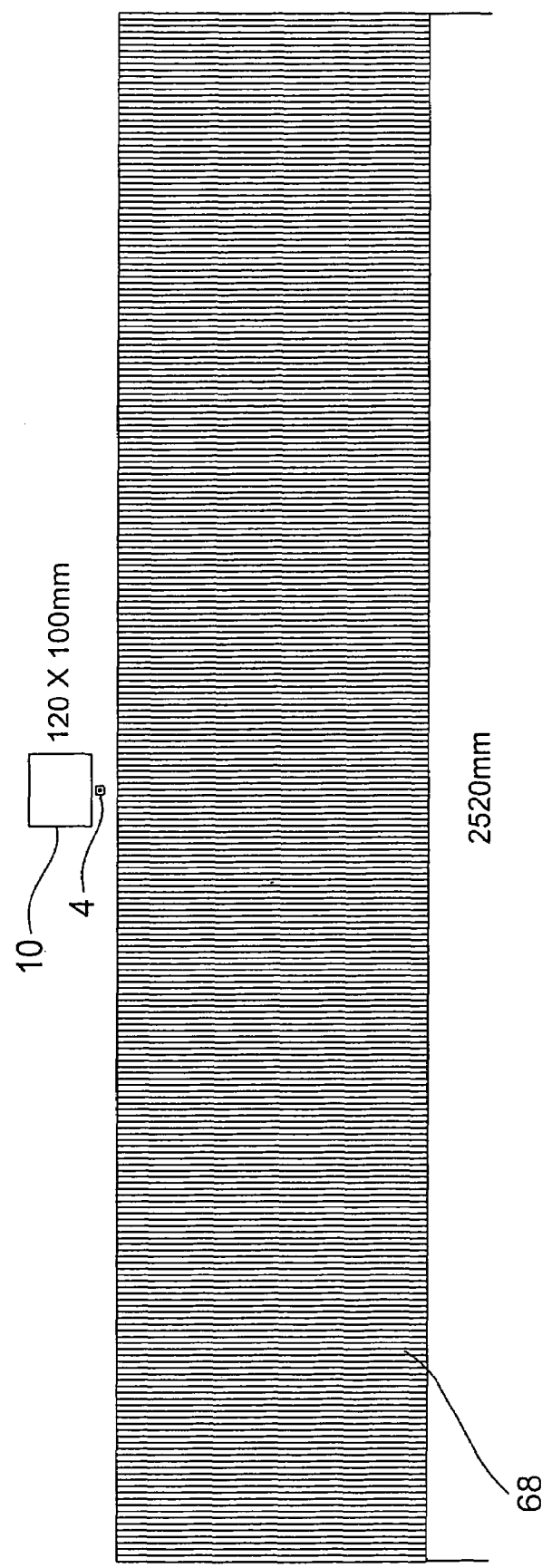
FIG. 13 is a fragmentary schematic top plan view showing an electronic-component automatic mounting apparatus equipped with a conventional electronic-component feeding device.
Figure 14:
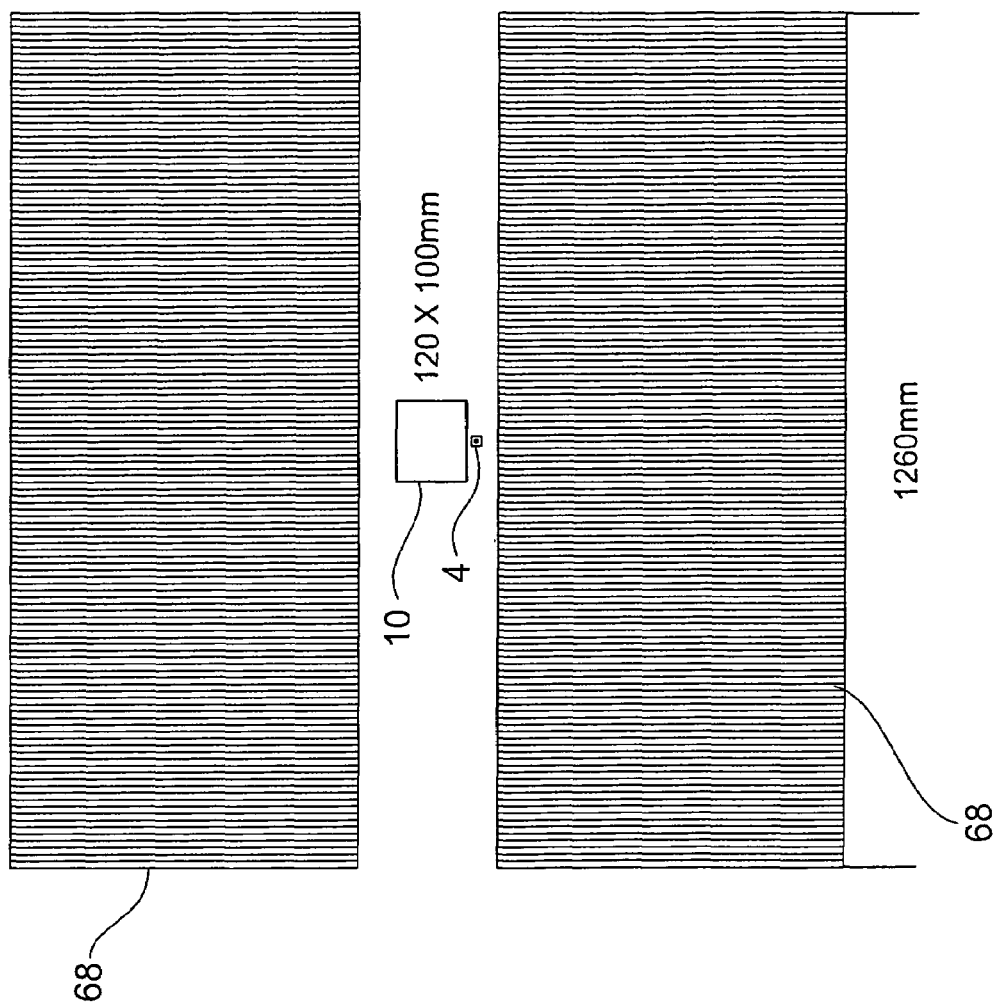
FIG. 14 is a fragmentary schematic top plan view showing an electronic-component automatic mounting apparatus equipped with a conventional electronic-component feeding device.

With reference to FIGS. 12 to 14, advantages of using the multistory rectangular-pipe type electronic-component feeding device 58 illustrated in FIG. 11 will be described below.

The following description will be made on the assumption that chip components are mounted on a printed-wiring board 10 having a width of 120 mm and a depth of 100 mm, by use of the component mounting head 4 in the electronic-component automatic mounting apparatus 1, as shown in FIG. 12,.

Referring to FIG. 12, six multistory rectangular-pipe type electronic-component feeding devices (stick feeders) 61 to 66 are incorporated in the electronic-component automatic mounting apparatus 1. The stick feeder 61 is prepared by aligning ten sticks for 1608-size chip resistors horizontally in parallel to form a stick group, and vertically superimposing three of the stick groups on each other. The stick feeder 62 is prepared by aligning twelve sticks for 1005-size chip resistors horizontally in parallel to form a stick group, and vertically superimposing three of the stick groups on each other. The stick feeder 63 is prepared by aligning twenty sticks for 0603-size chip resistors horizontally in parallel to form a stick group, and vertically superimposing three of the stick groups on each other. The stick feeder 64 is prepared by aligning ten sticks for 1608-size chip capacitors horizontally in parallel to form a stick group, and vertically superimposing three of the stick groups on each other. The stick feeder 65 is prepared by aligning twelve sticks for 1005-size chip capacitors horizontally in parallel to form a stick group, and vertically superimposing three of the stick groups on each other. The stick feeder 66 is prepared by aligning twenty sticks for 0603-size chip capacitors horizontally in parallel to form a stick group, and vertically superimposing three of the stick groups on each other.

Each of the feeders has a width of 20 mm, or the total width of the six feeders is 120 mm. A total of 252 rectangular pipes can be installed within a width of 120 mm, and each of the rectangular pipes can be filled with a different kind of chip component. Thus, a chip-type electronic-component feeding device capable of feeding 252 kinds of chip components can be provided.

While a printed-wiring board is being reduced in size in connection with downsizing of electronic devices, a mounting apparatus cannot be reduced in size due to difficulties in downsizing a component feeding section. The chip-type electronic-component feeding device (rectangular-pipe type electronic-component feeding device) makes it possible to provide a high density chip component feeding device so as to achieve a small-size mounting apparatus.

For example, in the printed-wiring board 10 having a width of 120 mm and a depth of 100 mm, as shown in FIG. 12, a total of 252 kinds of chip-type electronic-component feeding devices can be installed within the same width as that of the printed-wiring board. Thus, a distance which the component mounting head 4 in the electronic-component automatic mounting apparatus is required to moved to suck a chip component can be limited to the width of 120 mm even when all of the 252 kinds of chip components are sucked. Thus, the electronic-component automatic mounting apparatus 1 can perform a high-speed mounting operation in a compact structure.

FIG. 13 is a top plan view of an electronic-component automatic mounting apparatus for the same printed-wiring board 10 (width: 120 mm, depth: 100 mm) as that in FIG. 12, wherein 8-mm tape feeders 68 are substituted for all of the chip-type electronic-component feeding devices.

Currently, commercially available 8-mm tape feeders have a minimum width of 10 mm. Thus, given that a component feeding section per 8-mm tape feeder has a width of 10 mm, when 252 of the 8-mm tape feeders 68 are installed and 252 kinds of chip components are fed as in FIG. 12, the total width of the chip-type electronic-component feeders is 2520 mm. This total width is 21 times greater than that of the electronic-component feeding devices in FIG. 12. Therefore, the component mounting head 4 has to be moved over 2520 mm in a width direction to suck all of the 252 kinds of chip components, which leads to an increase in width of a base or table of the electronic-component automatic mounting apparatus.

FIG. 14 is a top plan view showing a table having a width which is reduced in half by dividing the 8-mm tape feeder 68 in FIG. 13 into two parts and arranging them on the front and rear sides of the table, respectively. In this case, the chip-type electronic-component feeders still have a width of 1260 mm, which is 10.5 times greater than that of the stick feeders according to the above embodiment in FIG. 12.

While a printed-wiring board 10 is being increasingly reduced in size along with downsizing of electronic devices, such as portable phones, mobile devices, digital cameras and camcorders, and increase of module boards, an electronic-component mounting apparatus cannot be reduced in size due to difficulties in downsizing an electronic-component feeder based on the premise of using the conventional tape feeder, as described above.

In this connection, the rectangular-pipe type electronic-component feeding device (including both the single-story type and multistory type) according to the above embodiments of the present invention as illustrated in FIGS. 3 to 5, 8 and 11 can provide a revolutionary electronic-component automatic mounting apparatus capable of incorporating a number of various chip-type electronic-component feeders in a significantly small installation space.

The rectangular-pipe type electronic-component feeding device described in connection with FIGS. 3 to 14 is applicable to the electronic-component automatic mounting apparatus illustrated in FIGS. 1 and 2. In addition to the apparatus in FIGS. 1 and 2, this rectangular-pipe type electronic-component feeding device may be applied to an electronic-component automatic mounting apparatus for mounting a plurality of electronic components on a printed-wiring board, which comprises table means for supporting the printed-wiring board, a movable component-mounting head adapted to suck the electronic component fed from this electronic-component feeding device and mount the electronic component at a given position on the printed-wiring board, and component image-recognition/correction means for correcting a posture of the electronic component during the tome between the sucking and mounting of the electronic component by the component mounting head.

Figure 15:
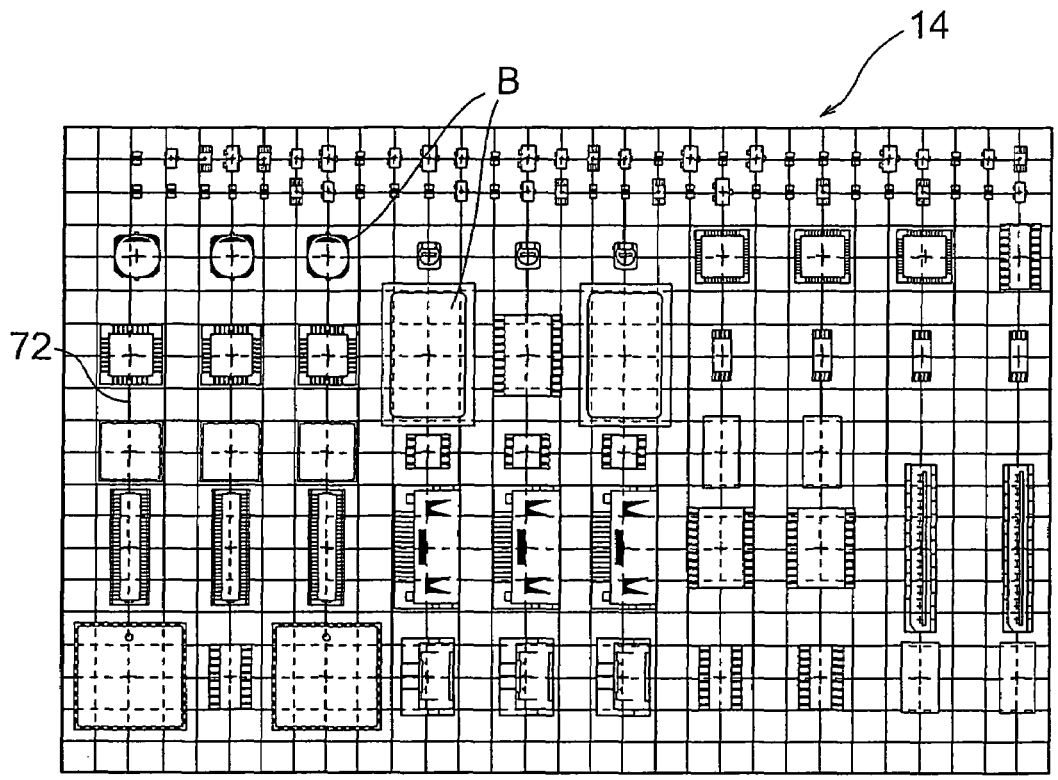
FIG. 15 is a top plan view showing a plate type electronic-component feeding device according to one embodiment of the present invention.
Figure 16:
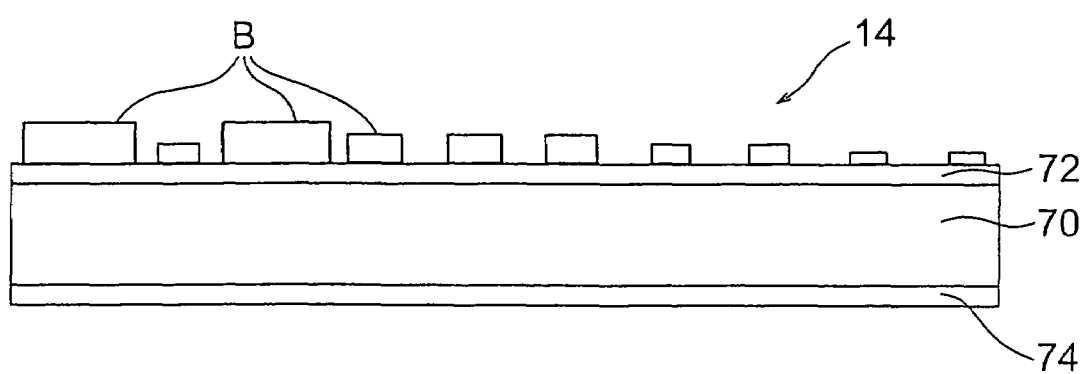
FIG. 16 is a front view of the plate type electronic-component feeding device in FIG. 15.
Figure 17:
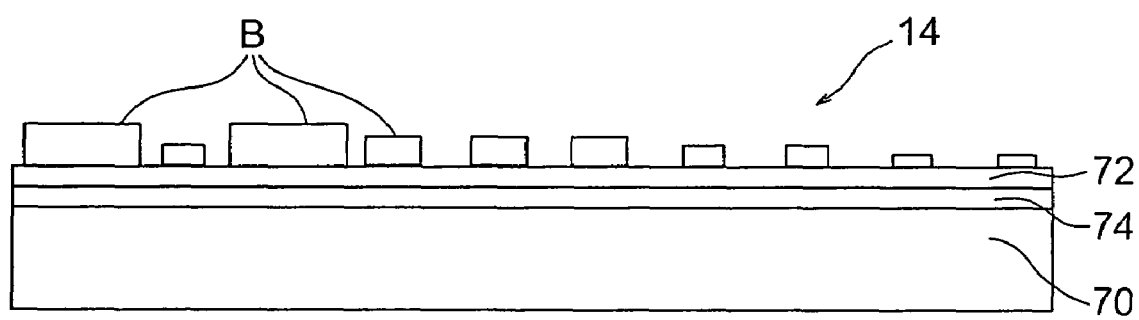
FIG. 17 is a top plan view showing a plate type electronic-component feeding device according to another embodiment of the present invention.

With reference to FIGS. 15 to 17, a plate type electronic-component feeding device according to one embodiment of the present invention will be described in detail below. FIGS. 15 and 16 are, respectively, a top plan view and a front view showing the plate type electronic-component feeding device. In the following description, the plate type electronic-component feeding device will be referred to occasionally as "plate feeder" for short.

As shown in FIGS. 15 and 16, the plate type electronic-component feeding device 14 comprises a plate 70 having a lattice-shaped marker with a predetermined pitch. A plurality of electronic components B are mixedly placed on the plate 70 in such a manner that each center of the electronic components B is located at either one of lattice intersections.

The plate 70 has a flat front surface coated with a film 72 which has a weak adhesion capable of preventing a side slipping of the electronic components B and allowing each of the electronic components B to be readily released from the plate during an operation for sucking the electronic component. A glue or paste having a slight or weak adhesion may be applied on the plate 70 to form the film 72.

Alternatively, a sheet, such as a silicon rubber sheet, having a surface friction coefficient capable of preventing a side slipping of the electronic components B and holding the electronic components B may be attached on the plate 70 to form the film 72.

The plate 70 is made of a transparent material, and the film (paste, silicon rubber sheet, etc.) 72 having weak adhesion is also made of a transparent material. Further, the plate 70 has a flat back surface on which a template 74 is attached. The template 74 indicates an image (graphic) and a positioning location which corresponds to each of the electronic components to be mixedly placed thereon. In an operation for manually arranging the electronic components B on the plate 70, an operator can readily recognize the kind and positioning location of an electronic component to be placed (that is, on which positioning location each kind of electronic components should be placed) in accordance with this template 72.

As shown in FIG. 17, this template 74 may be disposed between the film 72 and the front surface of the plate 70. In this case, as long as the film 72 has transparency, it is not essential that the plate 70 has transparency.

The plate 70 and the template 74 may be designed by directly using a printed-wiring board to which the electronic components. Further, a copy of the surface of the printed-wiring board may be used as the template 74.

In this manner, many kinds of electronic components B can be arranged on a common plate 70 at the same pitch with respect to each kind of electronic component. Thus, this plate 70 can be supplied as a component feeding section to an electronic-component automatic mounting apparatus. This makes it possible to provide a mixed-component feeding device capable of feeding unlimited kinds of electronic components by used of a common plate 70, and effectively facilitating space-saving and cost reduction, as compared to the tray feeder.

Further, in a high-mix low-volume manufacturing, the electronic components B may be manually arranged on the plate 70. In this case, the template (showing component location/image) 74 attached on the back surface of the plate 70 conveniently serves as an operational instruction for positioning locations.

The positioning location for each of the electronic components may be set with a certain degree of accuracy allowing the electronic component to be arranged at a position where a suction nozzle of a component mounting head in an electronic-component automatic mounting apparatus can pick up the component. Thus, the positioning location may be set with a relative low degree of accuracy as compared to component mounting positions. Specifically, as long as the component is roughly arranged at a position where the component mounting head can suck the component, the automatic mounting apparatus can correct the position of the component by image recognition after a sucking operation to mount the component on a printed-wiring board with a high degree of accuracy. Thus, the operation for manually arranging the electronic components B on the plate 70 is not very difficult.

Fundamentally, target electronic components B to be placed on the plate 70 are 8-mm tape components incapable of being fed by the aforementioned rectangular-pipe type electronic-component feeding device, or large-size electronic components to be fed by a tray or a wide tape with a width of 12 mm or more. These components are generally less frequently used. Thus, if these components are installed in the automatic mounting apparatus in the form of a tape or tray, the automatic mounting apparatus will have an excessive quantity of stock.

Moreover, the wide-tape feeder and tray feeder have disadvantages, namely, high cost and difficulties in feeding many kinds of electronic components due to the large area they occupy. In this connection, the plate type electronic-component feeding device 14 makes it possible to feed only a required number of many kinds of electronic components to the automatic mounting apparatus at a low cost and this device occupies a narrow area.

Thus, other frequently-used chip components or other components to be fed in the form of an 8-mm tape may be incorporated in the automatic mounting apparatus in the form of a tape feeder or the aforementioned rectangular-pipe type electronic-component feeding device (stick feeder), and only a necessary number and kind of the less-frequently-used components or components to be mounted on only one to several printed-wiring boards may be arranged on the plate 70, and fed to the automatic mounting apparatus only when necessary, or in a so-called "just-in-time system" manner, without there being an unprofitable excessive quantity of stock.

Figure 18:
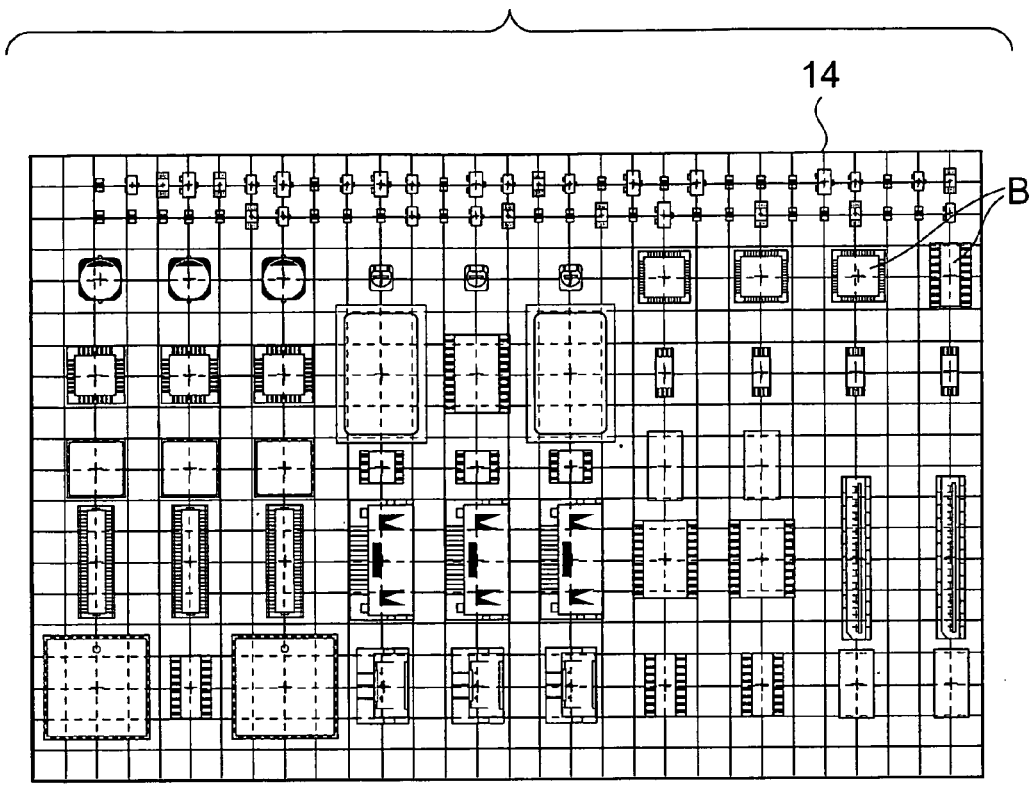
FIG. 18 is a top plan view showing a plate and a plurality of electronic components placed on the plate.
Figure 19:
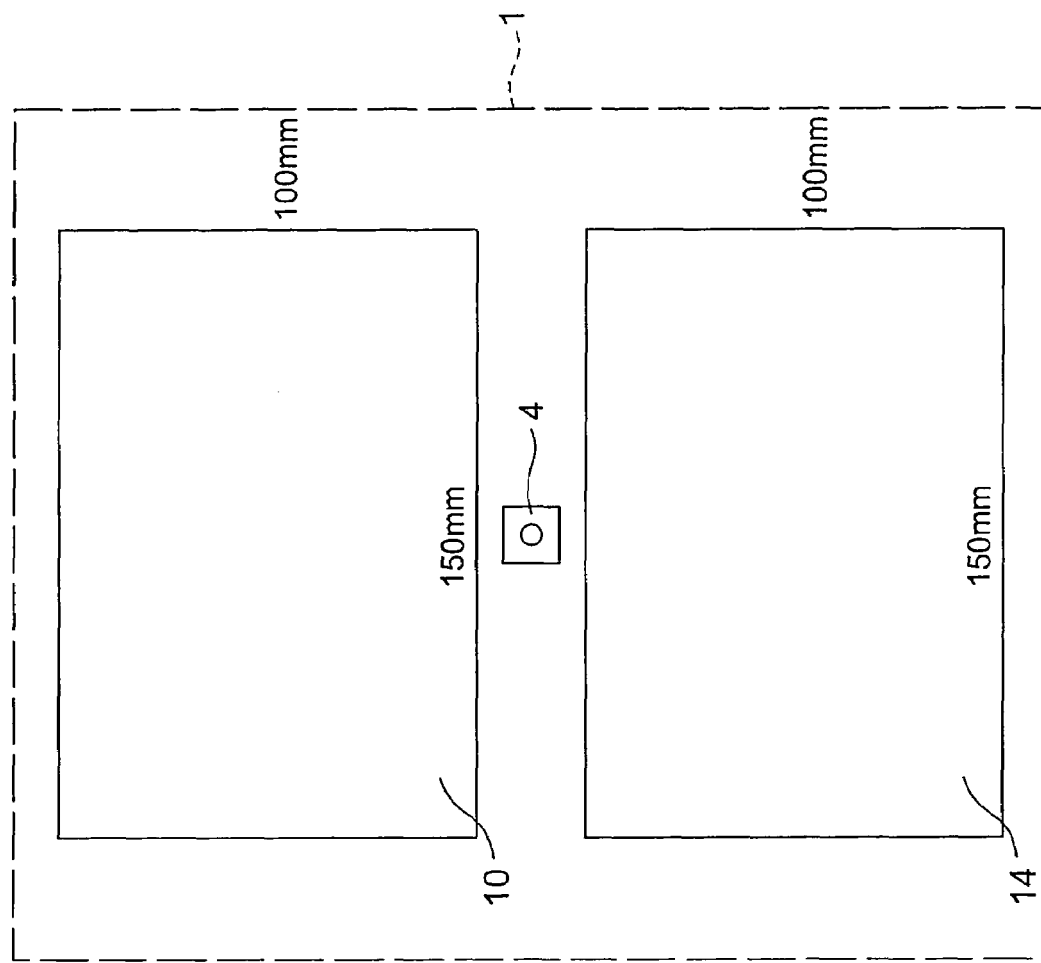
FIG. 19 is a schematic top plan view showing an electronic-component automatic mounting apparatus equipped with a plate type electronic-component feeding device according to one embodiment of the present invention.
Figure 20:
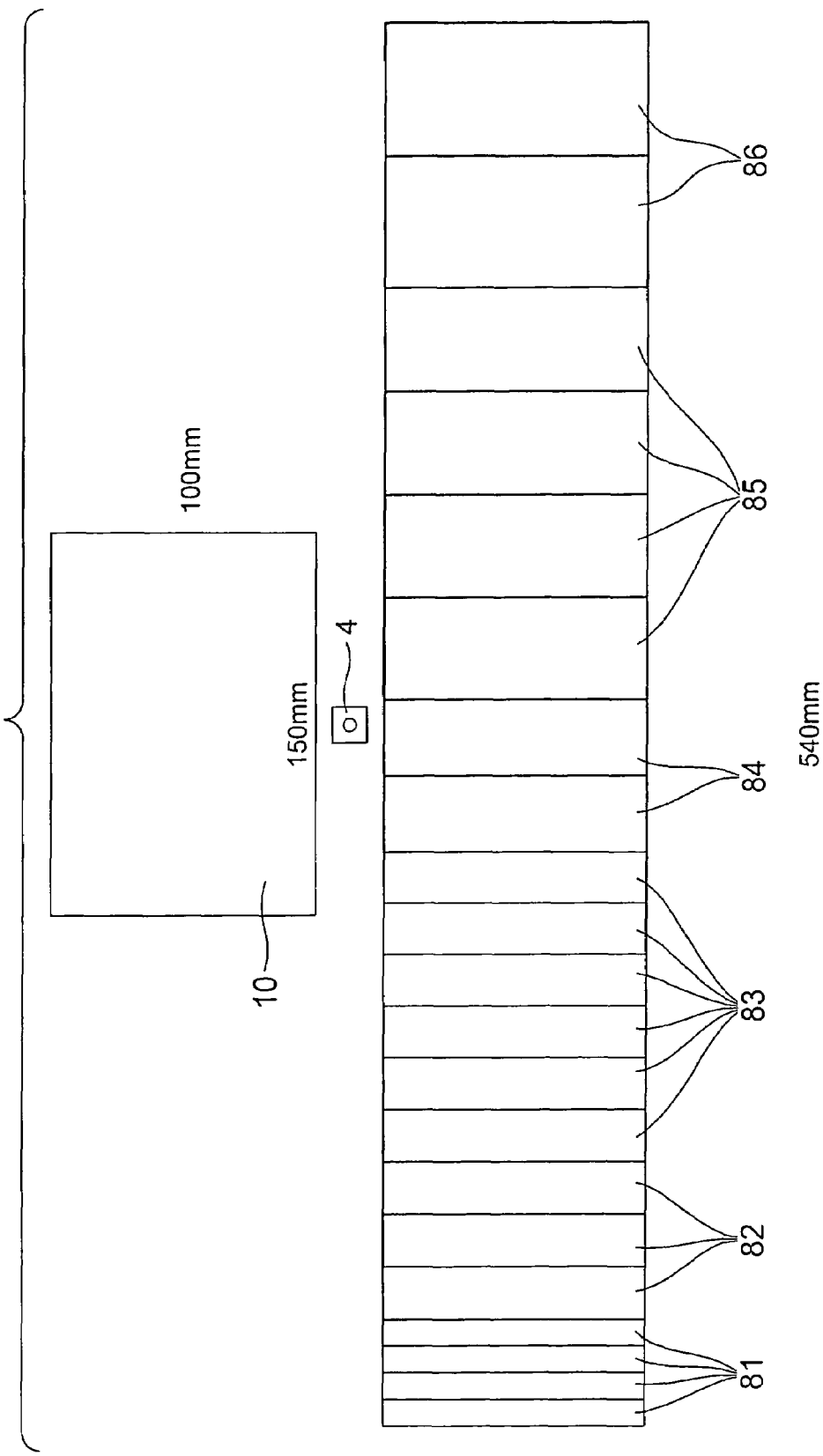
FIG. 20 is a fragmentary schematic top plan view showing an electronic-component automatic mounting apparatus equipped with a conventional electronic-component feeding device.

With reference to FIGS. 18 to 20, advantages of using the plate type electronic-component feeding device 14 illustrated in FIGS. 15 to 17 will be described below.

FIG. 18 is a top plan view showing the plate 70 and the electronic components B arranged on the plate 70. Four kinds of small-size components 201 to 204 capable of being fed by an 8-mm tape feeder, three kinds of medium-size components 205 to 207 capable of being fed by a 12-mm tape feeder, and fourteen kinds of large-size components 208 to 221 are arranged on the plate 70. The numerical value indicated on the side of each of the component groups is a tape width in a tape-based feeding.

FIG. 19 is a top plan view of an electronic-component automatic mounting apparatus loaded with a printed-wiring board 10 (width: 150 mm, depth: 100 mm). When all of the electronic components illustrated in FIG. 18 are fed by the plate type electronic-component feeding device 14, a distance which a component mounting head 4 of the automatic mounting apparatus is required to move to suck up the component is within 150 mm, which is the width of the plate type electronic-component feeding device. This makes it possible to downsize the electronic-component automatic mounting apparatus.

FIG. 20 is a top plan view of a conventional electronic-component automatic mounting apparatus where all of the above electronic components are fed by a tape feeder.

The respective widths of the tape feeders are 10 mm for an 8-mm tape feeder, 20 mm for 12-mm and 16-mm tape feeders, 30 mm for a 24-mm tape feeder, 40 mm for a 32-mm tape feeder and 50 mm for a 44-mm tape feeder. In this case, the respective number of the tape feeders are four for the 8-mm tape feeder 81, three for the 12-mm tape feeder 82, six for the 16-mm tape feeder 83, two for the 24-mm tape feeder 84, four for the 32-mm tape feeder 85 and two for the 44-mm tape feeder 86.

When all of the electronic components are fed by the tape feeders 81 to 86, the total length of a component feeding section is 540 mm. That is, the electronic component feeding using the conventional tape feeders illustrated in FIG. 20 requires a width of the component feeding section 3.6 times greater than that in the electronic component feeding using the plate type electronic-component feeding device 14 according to the above embodiment illustrated in FIG. 19.

When the plate type electronic-component feeding device 14 according to the above embodiment is used, all of the electronic components are arranged on the plate 70, and both a size of the printed-wiring board and a width of the electronic-component feeding device fall within a width of 150 mm. Thus, a width of the automatic mounting apparatus can be reduced.

As shown in FIG. 15, the plate 70 still has spaces, and can contain additional kinds of electronic components. Further, there remain many other components to be fed by a tray feeder, thus requiring a wider space, instead of the tape feeders. As compared to the feeding based on the plate 70 in FIG. 19, the feeding based on the conventional tape feeder as shown in FIG. 20 or tray feeder requires an extremely large space, and the feeder itself is costly.

As mentioned above, the plate type electronic-component feeding device 14 can feed a large number of kinds of electronic components per unit area and at a lower cost, as compared to an electronic-component automatic mounting apparatus incorporating a tape feeder or a tray feeder for feeding electronic components using a tray. Thus, the plate type electronic-component feeding device 14 makes it possible to significantly downsize the electronic-component automatic mounting apparatus.

Figure 21:
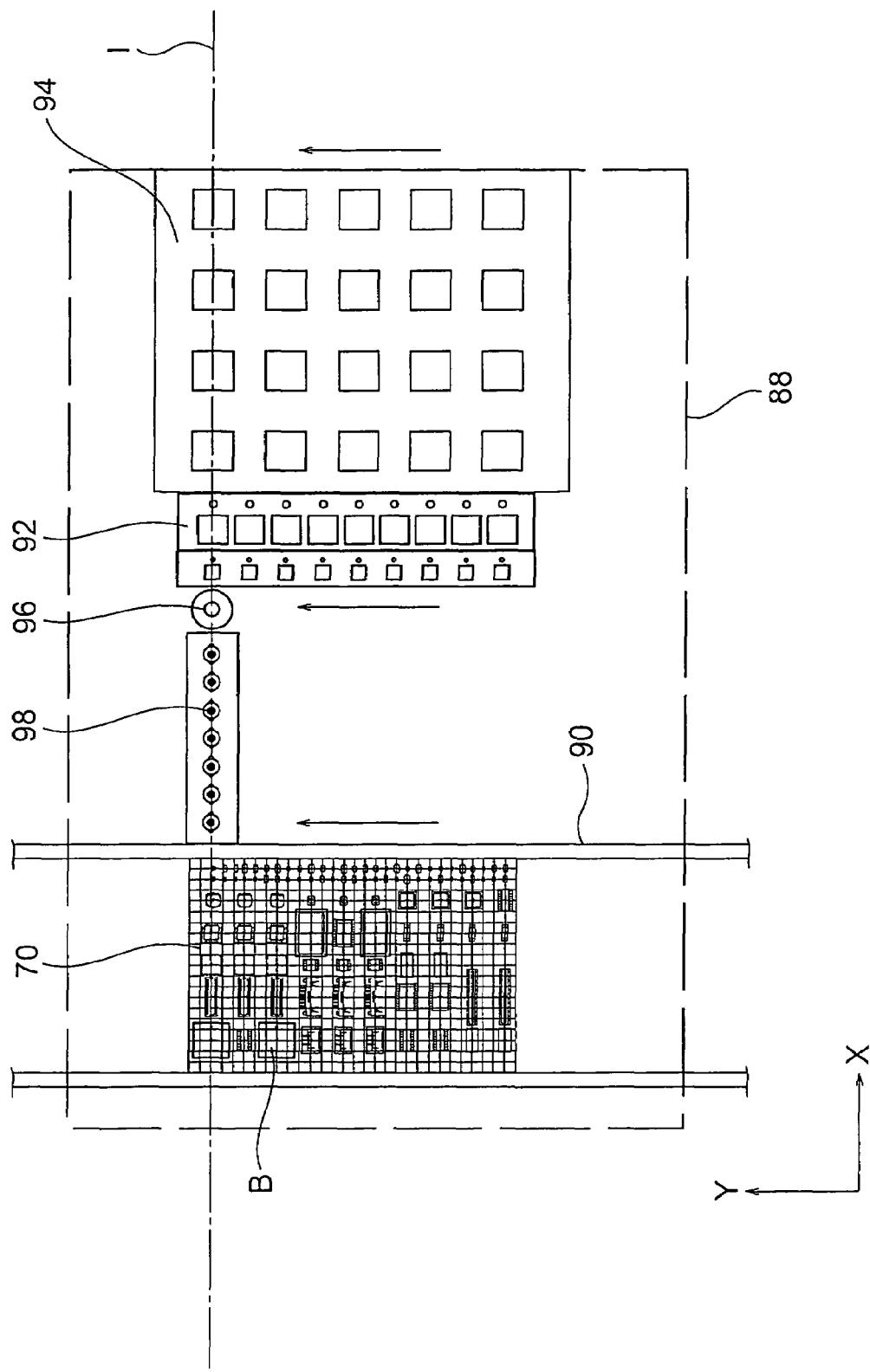
FIG. 21 is a top plan view showing an electronic-component sequencer unit according to one embodiment of the present invention.
Figure 22:
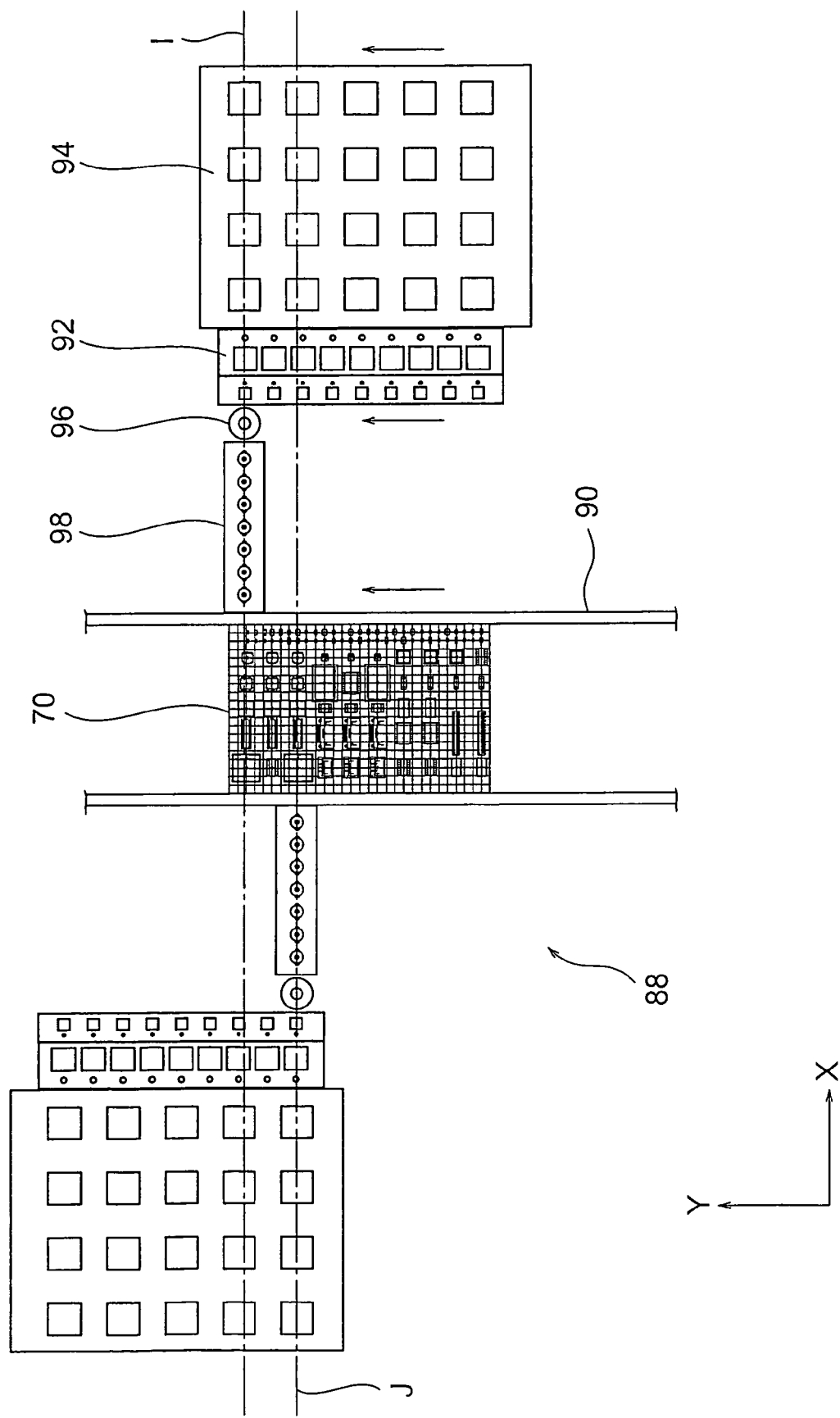
FIG. 22 is a top plan view showing an electronic-component sequencer unit according to another embodiment of the present invention.

With reference to FIGS. 21 and 22, an electronic-component sequencer unit for arranging many kinds of electronic components on a plate of the plate type electronic-component feeding device will be described below. FIG. 21 is a top plan view of the electronic-component sequencer unit.

As shown in FIG. 21, the electronic-component sequencer unit 88 comprises a plate conveyer 90 for conveying the plate 70 placed thereon, a tape feeder 92 and a tray feeder 94 serving as a component feeding section, and a picker 96 for picking up electronic components in the component feeding section and arranging the electronic components on the plate 70.

The picker 96 is designed to suck up the electronic components B while being reciprocated between the tape feeder 92, the tray feeder 94 and the plate 70, and arrange the electronic components at predetermined intervals on the plate 70.

A picker moving axis I for moving the picker 96 therealong is an X-axis, and the tape and tray feeders 92, 94 are attached in a Y-axis direction orthogonal to the picker moving axis I.

Each of the tape and tray feeders 92 and 94 is arranged such that a center of the electronic component at a component extraction position of the feeder is located just below the picker moving axis I. The plate 70 is also arranged such that one of the lattice lines of the plate 70 is located just below the picker moving axis I.

Further, a nozzle changer 98 loaded with a plurality of suction nozzles having various sizes is arranged between the tape and tray feeders 92, 94 and the plate 70 so as to allow a suction nozzle to be replaced depending on a size of the components.

In the above electronic-component sequencer unit 88, the picker 96 is firstly moved to a pre-programmed component extraction position (sucking up position) to suck up one of the components. Then, the picker 96 is moved to a pre-programmed arrangement position to arrange the component.

Each of the tape feeder 92 and the tray feeder 94 is designed to intermittently feed the components along the Y-axis direction by a given pitch, and, after completion of an operation for sucking up one of the component, continuously feed the next component to the component extraction position. Differently from the tape feeder, the tray feeder 94 is designed such that after one line of the components is extracted or picked up, the next line is fed to be located just below the picker moving axis I.

After completion of an operation for arranging the components on one lattice line of the plate 70, the plate 70 is intermittently fed by one lattice pitch, and the next lattice line is located just below the picker moving axis I. During the process of repeatedly sucking up one of the components and arranging the component on the plate 70, the picker 96 is operable to replace a suction nozzle with another suction nozzle suitable for a target one of the components through the nozzle changer 98.

FIG. 22 is a top plan view showing an electronic-component sequencer unit according to another embodiment of the present invention. In the electronic-component sequencer unit 88 illustrated in FIG. 21, two sets of the tape and tray feeders 92, 94, the picker 96 and the nozzle changer 98 are disposed on right and left sides across the plate 70. In this embodiment, each of the picker moving axes I, J of the right and left sets are displaced in the Y-axis direction by a given number of pitches.

According to this electronic-component sequencer unit 88, the number of tape and tray feeders 92, 94 is doubled, and the right and left pickers 96 can be simultaneously operated. Thus, not only the number of kinds of electronic components but also an arrangement speed can be doubled.

While the picker in each of the electronic-component sequencer units illustrated in FIGS. 21 and 22 is designed to be moved only in the X-axis direction, and the component feeding section is designed to be moved only in the Y-axis direction, the component feeding section may be fixed, and the picker may be designed to be moved in both the X-axis and Y-axis directions. In this case, the picker can be moved in both the X-axis and Y-axis directions to mixedly arrange each of the electronic components at a given position on the film of the plate.

Figure 23:
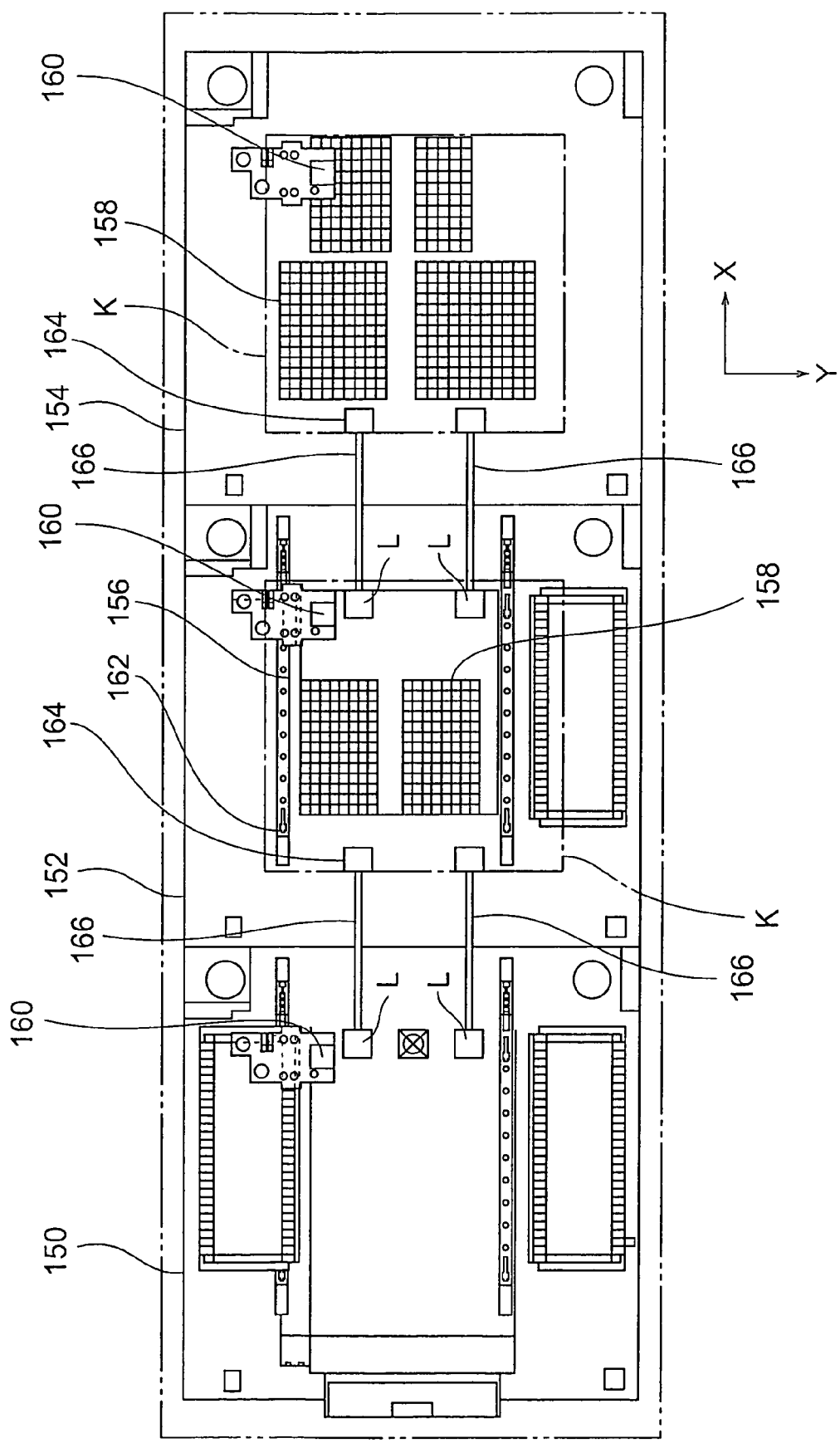
FIG. 23 is a top plan view showing an electronic-component sequencer unit according to yet another embodiment of the present invention.

With reference to FIG. 23, an electronic-component sequencer unit according to yet another embodiment of the present invention will be described below. FIG. 23 is a top plan view showing this electronic-component sequencer unit. The electronic-component sequencer unit illustrated in FIG. 23 is associated with a plurality of other electronic-component sequencer units, and these electronic-component sequencer units are associated with an electronic-component automatic mounting apparatus.

Specifically, the electronic-component automatic mounting apparatus 150, a sequencer module 152 serving as an electronic-component sequencer unit, a tape feeder and a tray feeder, and a sequencer module 154 serving as an electronic-component sequencer unit and a tray feeder, are associated with each other. A tape feeder 156 and a tray feeder 158 serving as a component feeding section are fixedly incorporated in the sequencer module 152, and a tray feeder 158 serving as a component feeding section is fixedly incorporated in the sequencer module 154. The sequencer module 152 is provided with a plural number of the tape feeders 156 and the tray feeders 158 each adapted to feed a different kind of electronic component, and designed to feed many kinds of electronic components.

Each of the sequencer modules 152, 154 is provided with a picker 160 for picking up electronic components from a component extraction position in each of the tape feeder 156 and the tray feeder 158. The picker 160 is designed to be moved in both X-axis and Y-axis directions so as to be moved over a picker moving range K as shown in FIG. 23.

Each of the sequencer modules 152, 154 is also provided with a nozzle changer 162 loaded with a plurality of suction nozzles having various sizes so as to allow a suction nozzle of the picker 160 to be replaced depending on a size of the components. The nozzle changer 162 is disposed within the picker moving range K.

Further, each of the sequencer modules 152, 154 is provided with a component receiving unit 164 adapted to receive the electronic component picked up by the picker 160. The component receiving unit 164 is also disposed within the picker moving range K. As with the aforementioned plate 70, the component receiving unit 164 has a flat surface coated with a film having a weak adhesion capable of preventing a side slipping of the electronic components and allowing each of the electronic components to be readily released from the plate during an operation for sucking up the electronic component. A paste or silicon rubber having a weak adhesion may be applied on the flat surface of the receiving unit 164 to form the film. Alternatively, a sheet, such as a silicon rubber sheet, having a surface friction coefficient capable of preventing a side slipping of the electronic components and holding the electronic components may be attached on the flat surface of the receiving unit 164 to form the film.

Furthermore, each of the sequencer modules 152, 154 is provided with a rod-less cylinder 166 serving as a component transfer unit adapted to transfer the component receiving unit itself which receives the electronic component to the adjacent electronic-component sequencer unit (or the electronic-component automatic mounting apparatus, etc.)

More specifically, as shown in FIG. 23, the rod-less cylinder 166 of the sequencer module 154 is designed to move the component receiving unit 161 loaded with the electronic components picked up from the tray feeder 158 to a position L where the picker 160 of the adjacent associated sequencer module 152 can extract the loaded components.

The sequencer module 152 is designed to move the component receiving unit 164 loaded with the electronic components picked up from the tape feeder 156 and the tray feeder 158 to a position L where the picker 160 of the adjacent associated sequencer module 164 can extract the loaded components.

As illustrated in the embodiment of FIG. 23, the electronic-component sequencer unit (sequencer modules 152, 154) may be associated with the electronic-component automatic mounting apparatus 150 to provide a system capable of feeding many kinds of electronic components to the electronic-component automatic mounting apparatus 150 online. While this system has a low mounting speed, it can mount many kinds of electronic components in a single process without preparing the aforementioned plate 70 in a preceding process to provide a low-cost electronic-component automatic mounting apparatus.

When an electronic-component sequencer unit for arranging many kinds of electronic components on the plate 70 of the aforementioned plate type electronic-component feeding device is associated with the electronic-component sequencer unit in place of the electronic-component automatic mounting apparatus 150 illustrated in FIG. 23, the electronic-component sequencer units can be formed as a module to pass electronic components through the component receiving unit 164 and the component transfer unit 166. Thus, a plurality of sequencer modules can be associated with each other one after the other to freely increase the number of kinds of electronic components so as to provide an electronic-component sequencer unit having high flexibility.

Figure 24:
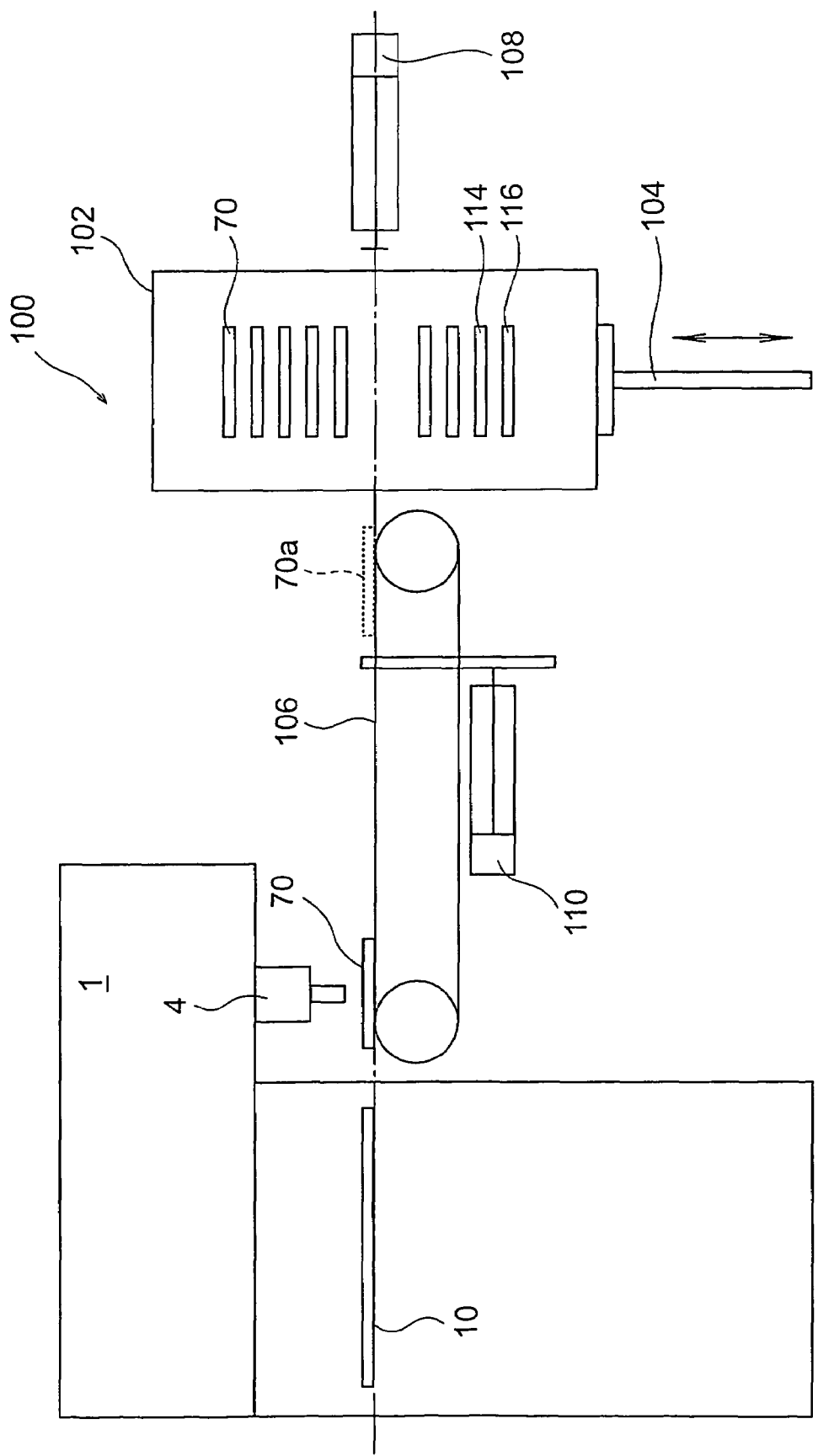
FIG. 24 is a schematic front view showing a plate feeder unit according to one embodiment of the present invention.

With reference to FIG. 24, a plate feeder unit for feeding a plate having many kinds of electronic components mixedly placed thereon according to one embodiment of the present invention will be described below.

As shown in FIG. 24, the plate feeder assembly 100 comprises a magazine 102 for storing a plurality of plates 70 each having many kinds of electronic components mixedly placed thereon in a plurality of slots arranged in a multilevel manner, a magazine lifter 104 for vertical moving the magazine 102 to take a plate 70 in and out of the magazine 102, and a conveyer belt 106 for feeding a plate 70 to an electronic-component automatic mounting apparatus 1. The plate feeder assembly 100 further includes a first pusher 108 for pushing out a plate 70 having electronic components placed thereon onto the conveyer belt 106, and a second pusher 110 for returning an empty plate 70 after completion of an mounting operation to the magazine 102.

In the above plate feeder unit 100, a plurality of plates 70 each having many kinds of electronic components placed thereon are pre-stored in upper slots in an order of mounting according to a software program. The magazine 102 is moved downward by the magazine lifter 104, and one component-containing plate 70 is pushed out onto the conveyer belt 106 by the first pusher 108. The plate 70 is moved to a position where a component mounting head 4 of the electronic-component automatic mounting apparatus 1 can pick up the components from the plate 70, and then fixed.

When the component mounting head 4 is designed to be moved in both X-axis and Y-axis directions, the plate 70 may be fixed simply within a component-mounting-head moving range. If the electronic-component automatic mounting apparatus is designed differently, it is necessary to move the plate or the electronic components in such a manner as to be located below the component mounting head.

After completion of an operation for mounting the electronic components on a printed-wiring board 10, the empty plate 70 is returned to a position adjacent to the magazine 102 by the conveyer belt 106, and stored in the original slot of the magazine 102.

As shown in FIG. 1, the electronic-component automatic mounting apparatus 1 includes not only the plate type electronic-component feeding device 14 using a plate but also the rectangular-pipe type electronic-component feeding device 12. Thus, the number and kinds of the electronic component which may be fed allows a single automatic mounting apparatus 1 to complete an operation for mounting electronic components on the printed-wiring board 10.

In this case, a plurality of electronic components including less-frequently-used electronic components are mixedly arranged on the plate 70 of the plate type electronic-component feeding device 14, in a number allowing the completion of a mounting operation for just one printed-wiring board 10. When the mounting operation for one printed-wiring board 10 is completed, the components on the plate 70 are all mounted or the plate 70 becomes empty. The finished printed-wiring board 10 is then ejected from the automatic mounting apparatus 1. Then, a new printed-wiring board 10 is installed in the automatic mounting apparatus 1 and positioned at a mounting position. During this replacing operation, the empty plate 70 may be replaced with a new plate 70 to achieve a machine operation free of time loss, and a "just-in-time production system"-like mounting process capable of eliminating the need for loading the automatic mounting apparatus with excess electronic components, and feeding only necessary electronic components only when necessary.

With reference to FIG. 24, a correction process in the event of a failure in an electric-component mounting operation for the one of electronic components arranged on a plate will be described below.

In the simplest correction process, the electronic-component automatic mounting apparatus 1 is stopped in response to occurrence of a failure in the mounting operation. Then, an operator is notified of an abnormality, and simultaneously the plate 70 is returned to a position 70*a* indicated by the broken line in FIG. 24 after some of a part of the electronic components on the plate 70 have been fed. The operator takes out the plate 70 from the position 70*a*, and manually corrects the electronic component 112 subject to the failure in the mounting operation and lacking. Then, the operator returns the plate 70 having a resupplied electronic component 112 to the position 70*a*. In response to turning on of a restart switch, the conveyer belt 106 is activated to move the plate 70 to a position where the component mounting head 4 of the electronic-component automatic mounting apparatus 1 can pick up the component 112, and then the plate 70 is returned to an original fixed position so as to restart the mounting operation.

In this case, a template 74 indicating respective kinds and positioning locations of the electronic components is attached on a back surface of the plate 70. Thus, the operator can check the template 74 through the transparent plate 70 to resupply the component without any error in arrangement. In addition, the electronic component 112 may be roughly arranged on the plate 70 at a position where the component mounting head 4 can suck up the component 112. Thus, the electronic component 112 can be manually arranged on the plate 70 without any problem.

With reference to FIGS. 24, 25(A) and 25(B), another correction process in the event of a failure in an operation for mounting one of the electronic components on a plate will be described below. FIG. 25(A) is a top plan view showing a first plate in the event of a failure in an operation for mounting one of the electronic component on the plate, and FIG. 25(B) is a top plan view showing the state after completion of an operation for mounting electronic components on a next plate used in the event of a failure of mounting one of the electronic component.

In the aforementioned process, when a failure in an electronic-component mounting operation occurs, the electronic-component automatic mounting apparatus 1 is stopped in the middle of the mounting operation, and the operator restarts the mounting operation. In the process illustrated in FIGS. 25(A) and 25(B), the automatic mounting operation is continued without stopping the electronic-component automatic mounting apparatus 1, and the correction operation is collectively performed in a subsequent step.

Specifically, as shown in FIG. 25(A), when the electronic-component automatic mounting apparatus 1 fails to mount an electronic component 112 indicated by the broken line on the plate 70, and the electronic component 112 and adequately mounted components become lacking, the plate feeder unit 100 (see FIG. 24) ejects the plate 70 lacking the component to the magazine 102 through the conveyer belt 106, and stores the plate 70 in one of defective-plate slots 114 provided in a lower portion of the magazine 102. Then, a new one of the plate 70 is moved by the conveyer belt 106 to a position where the component mounting head 4 of the electronic-component automatic mounting apparatus 1 can pick up the new component, and fixed at a position to continue the mounting operation and complete the mounting operation of one printed-wiring board.

The mounting operation of the newly supplied plate 70 is restarted from the position of the electronic component 112. Thus, the newly supplied plate 70 will come into the state where the electronic components to be mounted in the initial stage of the mounting operation are left as shown in FIG. 25(B).

Then, the plate 70 illustrated in FIG. 25(B) having only the electronic components to be mounted in the initial stage of the mounting operation is ejected to the magazine 102 through the conveyer belt 106, and stored in one of the defective-plate slots 116 provided in the lower portion of the magazine 102. The combination of the partly used plates 70 stored in the slots 114, 116 has the same electronic components as those on one normal unused plate 70 except for the electronic component 112. Thus, the electronic component 112 can be manually re-supplied to either one of the combination of the two plates to allow the set of two plates to serve as one normal unused plate.

This correction process may be collectively performed as the last stage of the mounting operation to allow the electronic-component automatic mounting apparatus 1 to be continuously operated without interruption. The partly used plates automatically stored in the defective-plate slots 114, 116 of the magazine 102 may be collectively corrected in the last stage of the mounting operation.

With reference to FIG. 26, a process for supplying a plurality of plate type electronic-component feeding devices (plate feeders), respectively, to a plurality of electronic-component automatic mounting apparatus according to a single electronic-component sequencer unit will be described below.

As shown in FIG. 26, a plate 70 having many kinds of electronic components mixedly placed thereon is stored in the magazine 102 according to the electronic-component sequencer unit 88. This magazine 102 is supplied as a common component feeding section to each of the plate feeder units 100 of the plurality of electronic-component automatic mounting apparatuses.

Generally, the mounting apparatus is loaded with a number of chip components. Thus, if frequently-used chip components and less-frequently-used electronic components can be fed, respectively, by the rectangular-pipe type electronic-component feeding device 12 and the plate type electronic-component feeding device 14 (plate feeder 14) to allow one electronic-component sequencer unit 88 to feed the plates 70 to a plurality of electronic-component automatic mounting apparatuses. For example, given that the mounting apparatus is loaded with chip components and frequently-used components for 80% of the total operating time thereof, and with less-frequently-used components for 20% of the total operating time thereof, and each of the electronic-component sequencer unit and the mounting apparatus has the same speed, a single electronic-component sequencer unit can supply the plates to five of the mounting apparatuses. Practically, in order to mount electronic components with a high degree of accuracy, the speed of the mounting apparatus becomes less than that of the electronic-component sequencer unit because the component is subjected to a recognition/correction operation using an image recognition unit before the mounting operation. Thus, a speed of the electronic-component sequencer unit in an operation for arranging electronic components on a plate 70 is greater than a mounting speed of the mounting apparatus, and thereby the single electronic-component sequencer unit can feed a further increased number of electronic components.

As explained above, electronic components can be pre-arranged on a plate 70, and fed to the mounting apparatus to provide higher efficiency. In a current manufacturing system, all of electronic components are incorporated in the mounting apparatus in the form of a tape or tray. This causes problems, namely, the need for a number of electronic-component feeding devices (feeders), and high manufacturing cost. Moreover, a large number of excess stock less-frequently-used components are incorporated in the mounting apparatus. All of the above problems can be solved by this embodiment.

The plate type electronic-component feeding device and related techniques described in connection with FIGS. 15 to 26 are applicable to the electronic-component automatic mounting apparatus illustrated in FIGS. 1 and 2. In addition to the apparatus in FIGS. 1 and 2, the plate type electronic-component feeding device may be applied to an electronic-component automatic mounting apparatus for mounting a plurality of electronic components on a printed-wiring board, which comprises table means for supporting the printed-wiring board, a movable component-mounting head adapted to suck up the electronic component fed from this electronic-component feeding device and mount the electronic component at a given position on the printed-wiring board, and component image-recognition/correction means for correcting a posture of the electronic component during the time between the sucking up and mounting of the electronic component by the component mounting head.

What is claimed is:

1. An electronic-component feeding device for feeding a plurality of chip-type electronic components, comprising:
    a pipe group being formed by a plurality of rectangular pipes arranged in parallel and in a high density, each of said rectangular pipes having an inner passage formed in conformity to an outer shape of said chip-type electronic component and allowing two or more of said chip-type electronic components to be aligned in a line along said inner passage;
    a component extraction portion formed in a first end of each rectangular pipe of said pipe group; and
    component feed means disposed at a second, opposite, end of each rectangular pipe of said pipe group, and adapted to feed the chip-type electronic component to a corresponding one of said component extraction portions wherein said component feed means comprises;
    a hopper group consisting of a plurality of hoppers each connected to a corresponding one of the second ends of said rectangular pipes, and adapted to store the chip-type electronic components in a bulk state;
    a hopper driven mechanism adapted to vertically move at least either one of said hopper group and each of said second ends of said rectangular pipes so as to supply the chip-type electronic components in said hopper group to each of the inner passages of said rectangular pipes; and
    shift means adapted to shift the chip-type electronic components in each of the inner passages of said rectangular pipes to a corresponding one of said component extraction portions;
    wherein said shift means is designed to supply positive pressure air intermittently, by synchronizing with the driving operation of said hopper drive mechanism, to said hopper group so as to shift the chip-type electronic components in each of the inner passages of said rectangular pipes to a corresponding one of said component extraction portions.

2. The electronic-component feeding device as defined in claim 1, which further includes magnet means disposed adjacent to each of said component extraction portions, and adapted to hold the chip-type electronic component at a component extraction position.

3. The electronic-component feeding device as defined in claim 1, wherein each of said rectangular pipes is made of stainless steel or plastic material.

4. The electronic-component feeding device as defined in claim 1, wherein each of said rectangular pipes is machined into a given shape in conformity to a shape of the chip-type electronic component and allowing only one of four side walls defining each of said second ends of said rectangular pipes to protrude relative to the remaining walls.

5. The electronic-component feeding device as defined in claim 1, which includes a plural number of said pipe groups vertically superimposed on each other.

* * * * *